(12) United States Patent
Ahn

(10) Patent No.: US 7,410,668 B2
(45) Date of Patent: Aug. 12, 2008

(54) METHODS, SYSTEMS, AND APPARATUS FOR UNIFORM CHEMICAL-VAPOR DEPOSITIONS

(75) Inventor: Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,595

(22) Filed: Aug. 31, 2004

(65) Prior Publication Data

US 2005/0034662 A1 Feb. 17, 2005

Related U.S. Application Data

(62) Division of application No. 09/797,324, filed on Mar. 1, 2001, now Pat. No. 6,852,167.

(51) Int. Cl.
*C23C 16/00* (2006.01)

(52) U.S. Cl. .................................. 427/248.1; 118/715

(58) Field of Classification Search .............. 427/248.1; 118/715
See application file for complete search history.

(56) References Cited

U.S. PATENT DOCUMENTS

| | | | |
|---|---|---|---|
| 134,376 A | 12/1872 | Gorton | |
| 1,124,262 A | 1/1915 | Beeler | |
| 2,501,563 A | 3/1950 | Colbert et al. | |
| 3,357,961 A | 12/1967 | Makowski et al. | |
| 3,381,114 A | 4/1968 | Nakanuma | 219/385 |
| 3,407,479 A | 10/1968 | Fordemwalt et al. | 29/577 |
| 3,457,123 A | 7/1969 | Van Pul | 148/1.5 |
| 3,471,754 A | 10/1969 | Hoshi et al. | 317/235 |

(Continued)

FOREIGN PATENT DOCUMENTS

EP 1096042 5/2001

(Continued)

OTHER PUBLICATIONS

U.S. Appl. No. 10/137,168, filed May 2, 2002, Methods for Atomic-Layer Deposition of Aluminum Oxides in Integrated Circuits.

(Continued)

*Primary Examiner*—Bret Chen
(74) *Attorney, Agent, or Firm*—Schwegman, Lundberg & Woessner, P.A.

(57) ABSTRACT

Integrated circuits, the key components in thousands of electronic and computer products, are generally built layer by layer on a silicon substrate. One common technique for forming layers is called chemical-vapor deposition (CVD.) Conventional CVD systems not only form layers that have non-uniform thickness, but also have large chambers that make the CVD process wasteful and slow. Accordingly, the inventor devised new CVD systems, methods, and apparatuses. One exemplary CVD system includes an outer chamber, a substrate holder, and a unique gas-distribution fixture. The fixture includes a gas-distribution surface having holes for dispensing a gas and a gas-confinement member that engages or cooperates with the substrate holder to form an inner chamber within the outer chamber. The inner chamber has a smaller volume than the outer chamber, which not only facilitates depositions of more uniform thickness, but also saves gas and speeds up the deposition process.

22 Claims, 4 Drawing Sheets

U.S. PATENT DOCUMENTS

| | | | |
|---|---|---|---|
| 3,689,357 A | 9/1972 | Jordan | 161/119 |
| 4,051,354 A | 9/1977 | Choate | 235/312 |
| 4,058,430 A | 11/1977 | Suntola et al. | 427/255.13 |
| 4,209,357 A * | 6/1980 | Gorin et al. | 438/710 |
| 4,215,156 A | 7/1980 | Dalal et al. | 427/84 |
| 4,292,093 A | 9/1981 | Ownby et al. | 148/4 |
| 4,305,640 A | 12/1981 | Cullis et al. | 350/96.1 |
| 4,333,808 A | 6/1982 | Bhattacharyya et al. | 204/192 D |
| 4,399,424 A | 8/1983 | Rigby | 338/34 |
| 4,413,022 A | 11/1983 | Suntola et al. | 427/255.2 |
| 4,590,042 A | 5/1986 | Drage | 422/186.06 |
| 4,604,162 A | 8/1986 | Sobczak | 156/657 |
| 4,663,831 A | 5/1987 | Birrittella et al. | 29/576 E |
| 4,673,962 A | 6/1987 | Chatterjee et al. | 357/23.6 |
| 4,761,768 A | 8/1988 | Turner et al. | 365/201 |
| 4,766,569 A | 8/1988 | Turner et al. | 365/185 |
| 4,767,641 A | 8/1988 | Kieser et al. | 427/38 |
| 4,894,801 A | 1/1990 | Saito et al. | 365/154 |
| 4,920,071 A | 4/1990 | Thomas | 437/188 |
| 4,920,396 A | 4/1990 | Shinohara et al. | 357/42 |
| 4,948,937 A | 8/1990 | Blank et al. | 219/121.6 |
| 4,962,879 A | 10/1990 | Goesele et al. | 228/116 |
| 4,987,089 A | 1/1991 | Roberts | 437/34 |
| 4,993,358 A | 2/1991 | Mahawili | 118/715 |
| 5,001,526 A | 3/1991 | Gotou | 357/23.6 |
| 5,006,192 A | 4/1991 | Deguchi | 156/345 |
| 5,017,504 A | 5/1991 | Nishimura et al. | 437/40 |
| 5,021,355 A | 6/1991 | Dhong et al. | 437/35 |
| 5,028,977 A | 7/1991 | Kenneth et al. | 357/43 |
| 5,032,545 A | 7/1991 | Doan et al. | 437/242 |
| 5,049,516 A | 9/1991 | Arima | |
| 5,080,928 A | 1/1992 | Klinedinst et al. | 427/70 |
| 5,089,084 A | 2/1992 | Chhabra et al. | 438/706 |
| 5,097,291 A | 3/1992 | Suzuki | 355/69 |
| 5,102,817 A | 4/1992 | Chatterjee et al. | 437/47 |
| 5,110,752 A | 5/1992 | Lu | 437/47 |
| 5,122,856 A | 6/1992 | Komiya | 357/55 |
| 5,156,987 A | 10/1992 | Sandhu et al. | 437/40 |
| 5,177,028 A | 1/1993 | Manning | 437/41 |
| 5,198,029 A | 3/1993 | Dutta et al. | 118/303 |
| 5,202,278 A | 4/1993 | Mathews et al. | 437/47 |
| 5,208,657 A | 5/1993 | Chatterjee et al. | 257/302 |
| 5,223,081 A | 6/1993 | Doan | 156/628 |
| 5,234,535 A | 8/1993 | Beyer et al. | 156/630 |
| 5,266,514 A | 11/1993 | Tuan et al. | 437/52 |
| 5,274,249 A | 12/1993 | Xi et al. | |
| 5,320,880 A | 6/1994 | Sandhu et al. | 427/578 |
| 5,324,980 A | 6/1994 | Kusunoki | 257/74 |
| 5,327,380 A | 7/1994 | Kersh, III et al. | 365/195 |
| 5,376,575 A | 12/1994 | Kim et al. | 437/52 |
| 5,391,911 A | 2/1995 | Beyer et al. | 257/522 |
| 5,392,245 A | 2/1995 | Manning | 365/200 |
| 5,393,704 A | 2/1995 | Huang et al. | 437/203 |
| 5,396,093 A | 3/1995 | Lu | 257/306 |
| 5,410,169 A | 4/1995 | Yamamoto et al. | 257/301 |
| 5,414,287 A | 5/1995 | Hong | 257/316 |
| 5,414,288 A | 5/1995 | Fitch et al. | 257/328 |
| 5,416,041 A | 5/1995 | Schwalke | 437/62 |
| 5,421,953 A | 6/1995 | Nagakubo et al. | 216/34 |
| 5,422,499 A | 6/1995 | Manning | 257/67 |
| 5,426,603 A | 6/1995 | Nakamura et al. | |
| 5,438,009 A | 8/1995 | Yang et al. | 437/52 |
| 5,440,158 A | 8/1995 | Sung-Mu | 257/314 |
| 5,441,591 A | 8/1995 | Imthurn et al. | 156/153 |
| 5,445,699 A * | 8/1995 | Kamikawa et al. | 156/345.24 |
| 5,445,986 A | 8/1995 | Hirota | 437/60 |
| 5,455,445 A | 10/1995 | Kurtz et al. | 257/419 |
| 5,460,316 A | 10/1995 | Hefele | 228/39 |
| 5,460,988 A | 10/1995 | Hong | 437/43 |
| 5,466,625 A | 11/1995 | Hsieh et al. | 437/52 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 437/60 |
| 5,495,441 A | 2/1996 | Hong | 365/185.01 |
| 5,497,017 A | 3/1996 | Gonzales | 257/306 |
| 5,504,357 A | 4/1996 | Kim et al. | 257/306 |
| 5,504,376 A | 4/1996 | Sugahara et al. | 257/768 |
| 5,508,219 A | 4/1996 | Bronner et al. | 437/52 |
| 5,508,542 A | 4/1996 | Geiss et al. | 257/301 |
| 5,522,932 A * | 6/1996 | Wong et al. | 118/715 |
| 5,528,062 A | 6/1996 | Hsieh et al. | 257/298 |
| 5,562,952 A | 10/1996 | Nakahigashi et al. | |
| 5,572,052 A | 11/1996 | Kashihara et al. | |
| 5,587,609 A | 12/1996 | Murakami et al. | |
| 5,593,912 A | 1/1997 | Rajeevakumar | 437/52 |
| 5,595,606 A | 1/1997 | Fujikawa et al. | 118/725 |
| 5,614,026 A * | 3/1997 | Williams | 118/723 ME |
| 5,616,934 A | 4/1997 | Dennison et al. | 257/67 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,674,563 A | 10/1997 | Tarui et al. | |
| 5,674,574 A | 10/1997 | Atwell et al. | 427/561 |
| 5,691,230 A | 11/1997 | Forbes | 437/62 |
| 5,698,022 A | 12/1997 | Glassman et al. | |
| 5,710,057 A | 1/1998 | Kenney | 437/62 |
| 5,735,960 A * | 4/1998 | Sandhu et al. | 118/723 IR |
| 5,745,334 A | 4/1998 | Hoffarth et al. | |
| 5,751,021 A | 5/1998 | Teraguchi | |
| 5,756,404 A | 5/1998 | Friedenreich et al. | 438/791 |
| 5,765,214 A | 6/1998 | Sywyk | |
| 5,789,030 A | 8/1998 | Rolfson | 429/309 |
| 5,792,269 A * | 8/1998 | Deacon et al. | 118/715 |
| 5,795,808 A | 8/1998 | Park | 438/301 |
| 5,801,105 A | 9/1998 | Yano et al. | 438/785 |
| 5,810,923 A | 9/1998 | Yano et al. | 117/84 |
| 5,822,256 A | 10/1998 | Bauer et al. | 365/200 |
| 5,827,571 A | 10/1998 | Lee et al. | |
| 5,828,080 A | 10/1998 | Yano et al. | 257/43 |
| 5,840,897 A | 11/1998 | Kirlin et al. | 546/2 |
| 5,879,459 A | 3/1999 | Gadgil et al. | |
| 5,892,249 A | 4/1999 | Courtright et al. | 257/209 |
| 5,912,797 A | 6/1999 | Schneemeyer et al. | |
| 5,916,365 A | 6/1999 | Sherman | 117/92 |
| 5,923,056 A | 7/1999 | Lee et al. | |
| 5,950,925 A | 9/1999 | Fukunaga et al. | 239/132.3 |
| 5,963,833 A | 10/1999 | Thakur | 438/677 |
| 5,994,240 A | 11/1999 | Thakur | 438/758 |
| 6,013,553 A | 1/2000 | Wallace et al. | 438/287 |
| 6,017,820 A * | 1/2000 | Ting et al. | 438/689 |
| 6,019,848 A * | 2/2000 | Frankel et al. | 118/715 |
| 6,020,024 A | 2/2000 | Maiti et al. | 427/248.1 |
| 6,020,243 A | 2/2000 | Wallace et al. | |
| 6,025,627 A | 2/2000 | Forbes et al. | 257/321 |
| 6,027,960 A | 2/2000 | Kusumoto et al. | 438/166 |
| 6,027,961 A | 2/2000 | Maiti et al. | 438/199 |
| 6,034,015 A | 3/2000 | Lin et al. | |
| 6,057,271 A | 5/2000 | Kenjiro et al. | 505/475 |
| 6,059,885 A | 5/2000 | Ohashi et al. | 118/730 |
| 6,060,755 A | 5/2000 | Ma et al. | |
| 6,093,623 A | 7/2000 | Forbes | 438/455 |
| 6,093,944 A | 7/2000 | VanDover | 257/310 |
| 6,110,529 A | 8/2000 | Gardiner et al. | 427/250 |
| 6,114,252 A | 9/2000 | Donohoe et al. | 438/710 |
| 6,120,531 A | 9/2000 | Zhou et al. | 607/111 |
| 6,127,287 A | 10/2000 | Hurley et al. | 438/791 |
| 6,143,582 A | 11/2000 | Vu et al. | 438/30 |
| 6,161,500 A | 12/2000 | Kopacz et al. | 118/723 E |
| 6,165,837 A | 12/2000 | Kawakubo et al. | 438/244 |
| 6,171,900 B1 | 1/2001 | Sun | 438/240 |
| 6,174,809 B1 | 1/2001 | Kang et al. | |
| 6,184,146 B1 | 2/2001 | Donohoe et al. | 438/710 |
| 6,187,484 B1 | 2/2001 | Glass et al. | 430/5 |

| Patent | Date | Inventor | Class |
|---|---|---|---|
| 6,194,262 B1 | 2/2001 | Noble | 438/253 |
| 6,203,613 B1 | 3/2001 | Gates et al. | 117/104 |
| 6,206,972 B1 | 3/2001 | Dunham | 118/715 |
| 6,207,522 B1 | 3/2001 | Hunt et al. | |
| 6,211,035 B1 | 4/2001 | Moise et al. | 438/396 |
| 6,211,039 B1 | 4/2001 | Noble | 438/412 |
| 6,218,293 B1 | 4/2001 | Kraus et al. | 438/644 |
| 6,225,168 B1 | 5/2001 | Gardner et al. | 438/287 |
| 6,230,651 B1 * | 5/2001 | Ni et al. | 118/723 I |
| 6,270,835 B1 | 8/2001 | Hunt et al. | |
| 6,274,479 B1 | 8/2001 | Srinivasan | 438/632 |
| 6,274,937 B1 | 8/2001 | Ahn et al. | |
| 6,281,042 B1 | 8/2001 | Ahn et al. | |
| 6,281,144 B1 | 8/2001 | Cleary et al. | 438/780 |
| 6,290,491 B1 | 9/2001 | Shahvandi et al. | 432/5 |
| 6,291,314 B1 | 9/2001 | Henley et al. | 438/458 |
| 6,294,813 B1 | 9/2001 | Forbes et al. | 257/321 |
| 6,296,943 B1 | 10/2001 | Watanabe | |
| 6,297,103 B1 | 10/2001 | Ahn et al. | |
| 6,297,539 B1 | 10/2001 | Ma et al. | 257/410 |
| 6,300,255 B1 * | 10/2001 | Venkataranan et al. | 438/787 |
| 6,303,481 B2 | 10/2001 | Park | 438/591 |
| 6,303,500 B1 | 10/2001 | Jiang et al. | 438/678 |
| 6,313,035 B1 | 11/2001 | Sandhu et al. | 438/681 |
| 6,317,175 B1 | 11/2001 | Salerno et al. | 349/45 |
| 6,331,465 B1 | 12/2001 | Forbes et al. | 438/260 |
| 6,342,445 B1 | 1/2002 | Marsh | 438/681 |
| 6,347,749 B1 * | 2/2002 | Moore et al. | 239/1 |
| 6,348,386 B1 | 2/2002 | Gilmer | 438/288 |
| 6,350,704 B1 | 2/2002 | Ahn et al. | |
| 6,352,591 B1 * | 3/2002 | Yieh et al. | 118/697 |
| 6,365,470 B1 | 4/2002 | Maeda | |
| 6,365,519 B2 | 4/2002 | Kraus et al. | 438/688 |
| 6,368,941 B1 | 4/2002 | Chen et al. | 438/424 |
| 6,380,579 B1 | 4/2002 | Nam et al. | 257/306 |
| 6,387,712 B1 | 5/2002 | Yano et al. | 438/3 |
| 6,391,769 B1 | 5/2002 | Lee et al. | 438/643 |
| 6,396,943 B2 | 5/2002 | Yamashita | |
| 6,420,230 B1 | 7/2002 | Derderian et al. | 438/255 |
| 6,420,279 B1 | 7/2002 | Ono et al. | 438/785 |
| 6,432,779 B1 | 8/2002 | Hobbs et al. | 438/287 |
| 6,433,993 B1 | 8/2002 | Hunt et al. | |
| 6,436,203 B1 | 8/2002 | Kaizuka et al. | 148/512 |
| 6,444,039 B1 | 9/2002 | Nguyen | 118/715 |
| 6,444,042 B1 | 9/2002 | Yang et al. | 118/724 |
| 6,444,895 B1 | 9/2002 | Nikawa | 136/212 |
| 6,445,023 B1 | 9/2002 | Vaartstra et al. | 257/295 |
| 6,448,192 B1 | 9/2002 | Kaushik | 438/785 |
| 6,451,641 B1 | 9/2002 | Halliyal et al. | 438/200 |
| 6,451,695 B2 | 9/2002 | Sneh | 438/685 |
| 6,454,912 B1 | 9/2002 | Ahn et al. | |
| 6,458,701 B1 | 10/2002 | Chae et al. | 438/680 |
| 6,461,436 B1 | 10/2002 | Campbell et al. | 118/715 |
| 6,461,970 B1 | 10/2002 | Yin | 438/710 |
| 6,465,334 B1 | 10/2002 | Buynoski et al. | 438/591 |
| 6,465,853 B1 | 10/2002 | Hobbs et al. | |
| 6,472,321 B2 | 10/2002 | Srinivasan et al. | 438/680 |
| 6,482,740 B2 | 11/2002 | Soininen et al. | 438/686 |
| 6,495,436 B2 | 12/2002 | Ahn et al. | 438/591 |
| 6,498,063 B1 | 12/2002 | Ping | 438/253 |
| 6,506,666 B2 | 1/2003 | Marsh | |
| 6,509,280 B2 | 1/2003 | Choi | |
| 6,514,348 B2 | 2/2003 | Miyamoto | 118/715 |
| 6,514,820 B2 | 2/2003 | Ahn et al. | |
| 6,514,828 B2 | 2/2003 | Ahn et al. | 438/297 |
| 6,518,610 B2 | 2/2003 | Yang et al. | 257/295 |
| 6,518,634 B1 | 2/2003 | Kaushik et al. | |
| 6,521,911 B2 | 2/2003 | Parsons et al. | 257/52 |
| 6,524,867 B2 | 2/2003 | Yang et al. | 438/3 |
| 6,524,901 B1 | 2/2003 | Trivedi | 438/183 |
| 6,533,867 B2 | 3/2003 | Doppelhammer | 118/715 |
| 6,534,357 B1 | 3/2003 | Basceri | 438/239 |
| 6,534,420 B2 | 3/2003 | Ahn et al. | 438/768 |
| 6,537,613 B1 | 3/2003 | Senzaki et al. | 427/250 |
| 6,541,079 B1 | 4/2003 | Bojarczuk, Jr. et al. | |
| 6,541,280 B2 | 4/2003 | Kaushik et al. | |
| 6,541,353 B1 | 4/2003 | Sandhu et al. | 438/478 |
| 6,544,846 B2 | 4/2003 | Ahn et al. | |
| 6,544,875 B1 | 4/2003 | Wilk | 438/591 |
| 6,551,893 B1 | 4/2003 | Zheng et al. | |
| 6,551,929 B1 | 4/2003 | Kori et al. | |
| 6,552,383 B2 | 4/2003 | Ahn et al. | |
| 6,559,472 B2 | 5/2003 | Sandhu et al. | 257/31 |
| 6,570,248 B1 | 5/2003 | Ahn et al. | |
| 6,573,199 B2 | 6/2003 | Sandhu et al. | 438/798 |
| 6,586,349 B1 | 7/2003 | Jeon et al. | |
| 6,586,792 B2 | 7/2003 | Ahn et al. | 257/295 |
| 6,592,661 B1 | 7/2003 | Thakur et al. | 117/2 |
| 6,592,942 B1 | 7/2003 | Van Wijck | |
| 6,593,610 B2 | 7/2003 | Gonzalez | 257/296 |
| 6,596,583 B2 | 7/2003 | Agarwal et al. | 438/255 |
| 6,596,636 B2 | 7/2003 | Sandhu et al. | 438/676 |
| 6,602,338 B2 | 8/2003 | Chen et al. | 106/287.19 |
| 6,608,378 B2 | 8/2003 | Anh et al. | 257/701 |
| 6,613,656 B2 | 9/2003 | Li | 438/584 |
| 6,613,702 B2 | 9/2003 | Sandhu et al. | 438/798 |
| 6,617,634 B2 | 9/2003 | Marsh et al. | 60/276 |
| 6,617,639 B1 | 9/2003 | Wang et al. | |
| 6,620,752 B2 | 9/2003 | Messing et al. | |
| 6,627,260 B2 | 9/2003 | Derderian et al. | 427/301 |
| 6,632,279 B1 | 10/2003 | Ritala et al. | |
| 6,638,859 B2 | 10/2003 | Sneh et al. | |
| 6,642,567 B1 | 11/2003 | Marsh | 257/306 |
| 6,642,573 B1 | 11/2003 | Halliyal et al. | |
| 6,652,924 B2 | 11/2003 | Sherman | |
| 6,656,371 B2 | 12/2003 | Drewes | 216/22 |
| 6,656,835 B2 | 12/2003 | Marsh et al. | 438/650 |
| 6,660,660 B2 | 12/2003 | Haukka et al. | 438/778 |
| 6,661,058 B2 | 12/2003 | Ahn et al. | 257/344 |
| 6,670,284 B2 | 12/2003 | Yin | 438/759 |
| 6,673,701 B1 | 1/2004 | Marsh et al. | 438/493 |
| 6,674,138 B1 | 1/2004 | Halliyal et al. | |
| 6,677,250 B2 | 1/2004 | Campbell et al. | 438/758 |
| 6,683,005 B2 | 1/2004 | Sandhu et al. | 438/715 |
| 6,686,212 B1 | 2/2004 | Conley, Jr. et al. | |
| 6,699,747 B2 | 3/2004 | Ruff et al. | |
| 6,709,989 B2 | 3/2004 | Ramdani et al. | |
| 6,710,538 B1 | 3/2004 | Ahn et al. | |
| 6,713,846 B1 | 3/2004 | Senzaki | 257/635 |
| 6,720,221 B1 | 4/2004 | Ahn et al. | |
| 6,728,092 B2 | 4/2004 | Hunt et al. | |
| 6,740,605 B1 | 5/2004 | Shiraiwa et al. | |
| 6,750,126 B1 | 6/2004 | Visokay et al. | |
| 6,756,298 B2 | 6/2004 | Ahn et al. | |
| 6,759,081 B2 | 7/2004 | Huganen et al. | |
| 6,760,257 B2 | 7/2004 | Huang et al. | |
| 6,767,582 B1 | 7/2004 | Elers | |
| 6,767,795 B2 | 7/2004 | Ahn et al. | |
| 6,770,536 B2 | 8/2004 | Wilk et al. | |
| 6,774,050 B2 | 8/2004 | Ahn et al. | |
| 6,777,353 B2 | 8/2004 | Putkonen | |
| 6,778,441 B2 | 8/2004 | Forbes et al. | |
| 6,780,704 B1 | 8/2004 | Raaijmakers et al. | |
| 6,787,370 B2 | 9/2004 | Forbes | |
| 6,787,413 B2 | 9/2004 | Ahn | |
| 6,790,791 B2 | 9/2004 | Ahn et al. | |
| 6,794,315 B1 | 9/2004 | Klemperer et al. | |
| 6,794,709 B2 | 9/2004 | Ahn et al. | |
| 6,800,567 B2 | 10/2004 | Cho | |
| 6,803,311 B2 | 10/2004 | Choi | |
| 6,803,326 B2 | 10/2004 | Ahn et al. | |
| 6,808,978 B2 | 10/2004 | Kim | |
| 6,812,100 B2 | 11/2004 | Ahn et al. | |
| 6,821,862 B2 | 11/2004 | Cho | |
| 6,821,873 B2 | 11/2004 | Visokay et al. | |
| 6,828,632 B2 | 12/2004 | Bhattacharyya | |

| | | | | | |
|---|---|---|---|---|---|
| 6,831,315 B2 | 12/2004 | Raaijmakers et al. | 2002/0089063 A1 | 7/2002 | Ahn et al. .................... 257/762 |
| 6,833,285 B1 | 12/2004 | Ahn et al. | 2002/0090806 A1 | 7/2002 | Ahn et al. .................... 438/618 |
| 6,833,308 B2 | 12/2004 | Ahn et al. | 2002/0094632 A1 | 7/2002 | Agarwal et al. |
| 6,835,111 B2 | 12/2004 | Ahn et al. | 2002/0100418 A1 | 8/2002 | Sandhu et al. |
| 6,844,203 B2 | 1/2005 | Ahn et al. | 2002/0102818 A1 | 8/2002 | Sandhu et al. ............. 438/479 |
| 6,844,260 B2 | 1/2005 | Sarigiannis et al. | 2002/0110991 A1 | 8/2002 | Li ............................. 438/387 |
| 6,852,167 B2 * | 2/2005 | Ahn .......................... 118/715 | 2002/0111001 A1 | 8/2002 | Ahn |
| 6,858,120 B2 | 2/2005 | Ahn et al. | 2002/0117704 A1 | 8/2002 | Gonzalez |
| 6,858,444 B2 | 2/2005 | Ahn et al. | 2002/0122885 A1 | 9/2002 | Ahn ...................... 427/255.28 |
| 6,858,865 B2 | 2/2005 | Ahn et al. | 2002/0130338 A1 | 9/2002 | Ahn et al. |
| 6,884,719 B2 | 4/2005 | Chang et al. | 2002/0135048 A1 | 9/2002 | Ahn et al. |
| 6,884,739 B2 * | 4/2005 | Ahn et al. .................... 438/783 | 2002/0142536 A1 | 10/2002 | Zhang et al. |
| 6,888,739 B2 | 5/2005 | Forbes | 2002/0145845 A1 | 10/2002 | Hunt et al. |
| 6,893,984 B2 | 5/2005 | Ahn et al. | 2002/0146916 A1 | 10/2002 | Irino et al. .................. 438/785 |
| 6,900,122 B2 | 5/2005 | Ahn et al. | 2002/0155688 A1 | 10/2002 | Ahn |
| 6,900,481 B2 | 5/2005 | Jin et al. | 2002/0155689 A1 | 10/2002 | Ahn |
| 6,914,800 B2 | 7/2005 | Ahn et al. | 2002/0164420 A1 | 11/2002 | Derderian et al. ........... 248/427 |
| 6,919,266 B2 | 7/2005 | Ahn et al. | 2002/0167057 A1 | 11/2002 | Ahn et al. |
| 6,921,702 B2 * | 7/2005 | Ahn et al. .................... 438/287 | 2002/0167089 A1 | 11/2002 | Ahn et al. .................... 257/762 |
| 6,930,346 B2 | 8/2005 | Ahn et al. | 2002/0170671 A1 | 11/2002 | Matsushita et al. |
| 6,953,730 B2 | 10/2005 | Ahn et al. | 2002/0176989 A1 | 11/2002 | Knudsen et al. |
| 6,958,302 B2 | 10/2005 | Ahn et al. | 2002/0177244 A1 | 11/2002 | Hsu et al. |
| 6,960,538 B2 | 11/2005 | Ahn et al. | 2002/0177282 A1 | 11/2002 | Song |
| 6,989,573 B2 | 1/2006 | Ahn et al. | 2002/0192974 A1 | 12/2002 | Ahn et al. .................... 438/722 |
| 7,012,311 B2 | 3/2006 | Ohmi et al. | 2002/0192975 A1 | 12/2002 | Ahn |
| 7,026,694 B2 | 4/2006 | Ahn et al. | 2002/0192979 A1 | 12/2002 | Ahn |
| 7,045,430 B2 | 5/2006 | Ahn et al. | 2002/0195056 A1 | 12/2002 | Sandhu et al. |
| 7,049,192 B2 | 5/2006 | Ahn et al. | 2003/0001212 A1 | 1/2003 | Hu et al. ..................... 257/388 |
| 7,064,058 B2 | 6/2006 | Ahn et al. | 2003/0001241 A1 | 1/2003 | Chakrabarti et al. |
| 7,068,544 B2 | 6/2006 | Forbes et al. | 2003/0003702 A1 | 1/2003 | Ahn |
| 7,071,066 B2 | 7/2006 | Wang et al. | 2003/0003722 A1 | 1/2003 | Vaartstra |
| 7,081,421 B2 | 7/2006 | Ahn et al. | 2003/0003730 A1 | 1/2003 | Li ............................. 438/680 |
| 7,084,078 B2 | 8/2006 | Ahn et al. | 2003/0008243 A1 | 1/2003 | Ahn et al. .................... 430/314 |
| 7,101,813 B2 | 9/2006 | Ahn et al. | 2003/0017717 A1 | 1/2003 | Ahn |
| 7,122,415 B2 | 10/2006 | Jang et al. | 2003/0020169 A1 | 1/2003 | Ahn et al. .................... 257/762 |
| 7,129,553 B2 | 10/2006 | Ahn et al. | 2003/0020180 A1 | 1/2003 | Ahn et al. .................... 257/786 |
| 7,135,369 B2 | 11/2006 | Ahn et al. | 2003/0027360 A1 | 2/2003 | Hsu et al. |
| 7,135,421 B2 | 11/2006 | Ahn et al. | 2003/0032270 A1 | 2/2003 | Snyder et al. |
| 7,160,577 B2 * | 1/2007 | Ahn et al. ............. 427/255.31 | 2003/0042526 A1 | 3/2003 | Weimer ....................... 257/309 |
| 7,160,817 B2 | 1/2007 | Marsh | 2003/0043637 A1 | 3/2003 | Forbes et al. |
| 7,169,673 B2 | 1/2007 | Ahn et al. | 2003/0045060 A1 | 3/2003 | Ahn et al. |
| 7,183,186 B2 | 2/2007 | Ahn et al. | 2003/0045078 A1 | 3/2003 | Ahn et al. |
| 7,192,824 B2 | 3/2007 | Ahn et al. | 2003/0045082 A1 | 3/2003 | Eldridge et al. ............. 438/593 |
| 7,192,892 B2 | 3/2007 | Ahn et al. | 2003/0048666 A1 | 3/2003 | Eldridge et al. ........ 365/185.28 |
| 7,195,999 B2 | 3/2007 | Forbes et al. | 2003/0049942 A1 | 3/2003 | Haukka et al. |
| 7,199,023 B2 | 4/2007 | Ahn et al. | 2003/0052356 A1 | 3/2003 | Yang et al. .................. 257/309 |
| 7,211,492 B2 | 5/2007 | Forbes et al. | 2003/0052358 A1 | 3/2003 | Weimer ....................... 257/310 |
| 7,214,994 B2 | 5/2007 | Forbes et al. | 2003/0059535 A1 | 3/2003 | Luo et al. |
| 7,235,501 B2 | 6/2007 | Ahn et al. | 2003/0064607 A1 | 4/2003 | Leu et al. |
| 2002/0019125 A1 | 2/2001 | Juengling et al. | 2003/0089314 A1 | 5/2003 | Matsuki et al. ............. 118/715 |
| 2002/0037603 A1 | 3/2001 | Eldridge et al. | 2003/0102501 A1 | 6/2003 | Yang et al. .................. 257/295 |
| 2001/0002280 A1 | 5/2001 | Sneh | 2003/0104666 A1 | 6/2003 | Bojarczuk, Jr. et al. |
| 2001/0002582 A1 | 6/2001 | Dunham .................... 118/715 | 2003/0119246 A1 | 6/2003 | Ahn |
| 2001/0005625 A1 | 6/2001 | Sun et al. | 2003/0119291 A1 | 6/2003 | Ahn et al. |
| 2001/0009383 A1 | 7/2001 | Nakayama et al. .......... 326/121 | 2003/0119313 A1 | 6/2003 | Yang et al. .................. 438/681 |
| 2001/0009695 A1 | 7/2001 | Saanila et al. .......... 427/255.39 | 2003/0132491 A1 | 7/2003 | Ahn |
| 2001/0010957 A1 | 8/2001 | Forbes et al. ................ 438/248 | 2003/0139039 A1 | 7/2003 | Ahn et al. |
| 2001/0014526 A1 | 8/2001 | Clevenger et al. | 2003/0157764 A1 | 8/2003 | Ahn et al. .................... 438/212 |
| 2001/0019876 A1 | 9/2001 | Juengling et al. | 2003/0159653 A1 | 8/2003 | Dando et al. ................. 118/715 |
| 2001/0030352 A1 | 10/2001 | Ruf et al. | 2003/0170389 A1 | 9/2003 | Sandhu .................... 427/255.28 |
| 2001/0034117 A1 | 10/2001 | Eldridge et al. | 2003/0170403 A1 | 9/2003 | Doan et al. .................... 427/569 |
| 2002/0001971 A1 | 1/2002 | Cho .......................... 438/765 | 2003/0175411 A1 | 9/2003 | Kodas et al. .................... 427/58 |
| 2002/0004276 A1 | 1/2002 | Ahn et al. | 2003/0181039 A1 | 9/2003 | Sandhu et al. ............. 438/685 |
| 2002/0004277 A1 | 1/2002 | Ahn et al. | 2003/0183156 A1 | 10/2003 | Dando et al. .................. 117/84 |
| 2002/0024080 A1 | 2/2002 | Derderian et al. ........... 257/301 | 2003/0185980 A1 | 10/2003 | Endo |
| 2002/0025628 A1 | 2/2002 | Derderian et al. ........... 438/253 | 2003/0194861 A1 | 10/2003 | Mardian et al. ............. 438/680 |
| 2002/0046705 A1 | 4/2002 | Sandhu et al. ............. 118/719 | 2003/0194862 A1 | 10/2003 | Mardian .................... 438/680 |
| 2002/0053869 A1 | 5/2002 | Ahn et al. | 2003/0203626 A1 | 10/2003 | Derderian et al. ........... 438/689 |
| 2002/0068466 A1 | 6/2002 | Lee, et al. | 2003/0207032 A1 * | 11/2003 | Ahn et al. ............. 427/255.34 |
| 2002/0072164 A1 | 6/2002 | Umotoy et al. | 2003/0207540 A1 | 11/2003 | Ahn et al. |
| 2002/0086507 A1 | 7/2002 | Park et al. .................... 438/585 | 2003/0207564 A1 | 11/2003 | Ahn et al. .................... 438/638 |
| 2002/0086555 A1 | 7/2002 | Ahn et al. .................... 438/783 | 2003/0207593 A1 | 11/2003 | Derderian et al. ........... 438/778 |
| 2002/0089023 A1 | 7/2002 | Yu et al. .................... 257/411 | 2003/0209324 A1 | 11/2003 | Fink ....................... 156/345.48 |

| | | | | | | |
|---|---|---|---|---|---|---|
| 2003/0216038 A1 | 11/2003 | Madhukar et al. | | 2005/0145959 A1 | 7/2005 | Forbes |
| 2003/0222300 A1 | 12/2003 | Basceri et al. ............... 257/309 | | 2005/0260357 A1 | 11/2005 | Olsen et al. |
| 2003/0227033 A1 | 12/2003 | Ahn et al. | | 2005/0285225 A1 | 12/2005 | Ahn et al. |
| 2003/0228747 A1 | 12/2003 | Ahn et al. .................... 438/591 | | 2006/0019033 A1 | 1/2006 | Muthukrishnan et al. |
| 2003/0235961 A1 | 12/2003 | Metzner et al. | | 2006/0023513 A1 | 2/2006 | Forbes et al. |
| 2004/0004244 A1 | 1/2004 | Ahn et al. .................... 257/314 | | 2006/0024975 A1 | 2/2006 | Ahn et al. |
| 2004/0004245 A1 | 1/2004 | Forbes et al. ................. 237/315 | | 2006/0028867 A1 | 2/2006 | Forbes et al. |
| 2004/0004247 A1 | 1/2004 | Forbes et al. ................. 257/324 | | 2006/0028869 A1 | 2/2006 | Forbes et al. |
| 2004/0004859 A1 | 1/2004 | Forbes et al. ............ 365/185.05 | | 2006/0043492 A1 | 3/2006 | Ahn et al. |
| 2004/0007171 A1 | 1/2004 | Ritala et al. | | 2006/0043504 A1 | 3/2006 | Ahn et al. |
| 2004/0009679 A1 | 1/2004 | Yeo et al. | | 2006/0046505 A1 | 3/2006 | Ahn et al. |
| 2004/0016944 A1 | 1/2004 | Ahn et al. | | 2006/0046522 A1 | 3/2006 | Ahn et al. |
| 2004/0023461 A1 | 2/2004 | Ahn et al. | | 2006/0125030 A1 | 6/2006 | Ahn et al. |
| 2004/0028811 A1 | 2/2004 | Cho et al. | | 2006/0128168 A1 | 6/2006 | Ahn et al. |
| 2004/0033661 A1 | 2/2004 | Yeo et al. | | 2006/0148180 A1 | 7/2006 | Ahn et al. |
| 2004/0033681 A1 | 2/2004 | Ahn et al. | | 2006/0176645 A1 | 8/2006 | Ahn et al. |
| 2004/0033701 A1 | 2/2004 | Ahn et al. .................... 438/785 | | 2006/0177975 A1 | 8/2006 | Ahn et al. |
| 2004/0038554 A1 | 2/2004 | Ahn | | 2006/0183272 A1 | 8/2006 | Ahn et al. |
| 2004/0043541 A1 | 3/2004 | Ahn | | 2006/0189154 A1 | 8/2006 | Ahn et al. |
| 2004/0043569 A1 | 3/2004 | Ahn | | 2006/0223337 A1 | 10/2006 | Ahn et al. |
| 2004/0043635 A1 | 3/2004 | Vaartstra | | 2006/0228868 A1 | 10/2006 | Ahn et al. |
| 2004/0065255 A1 | 4/2004 | Yang et al. .................. 118/715 | | 2006/0237764 A1 | 10/2006 | Ahn et al. |
| 2004/0110348 A1 | 6/2004 | Ahn et al. | | 2006/0244082 A1 | 11/2006 | Ahn et al. |
| 2004/0110391 A1 | 6/2004 | Ahn et al. | | 2006/0244100 A1 | 11/2006 | Ahn et al. |
| 2004/0135186 A1 | 7/2004 | Yamamoto | | 2006/0245984 A1 | 11/2006 | Kulkarni et al. |
| 2004/0144980 A1 | 7/2004 | Ahn et al. | | 2006/0246741 A1 | 11/2006 | Ahn et al. |
| 2004/0159863 A1 | 8/2004 | Eldridge et al. | | 2006/0252211 A1 | 11/2006 | Ahn et al. |
| 2004/0164357 A1 | 8/2004 | Ahn et al. | | 2006/0255470 A1 | 11/2006 | Ahn et al. |
| 2004/0164365 A1 | 8/2004 | Ahn et al. | | 2006/0261397 A1 | 11/2006 | Ahn |
| 2004/0168627 A1 | 9/2004 | Conley, Jr. et al. | | 2006/0263972 A1 | 11/2006 | Ahn et al. |
| 2004/0169453 A1 | 9/2004 | Ahn et al. | | 2006/0264064 A1 | 11/2006 | Ahn et al. |
| 2004/0171280 A1 | 9/2004 | Conley, Jr. et al. | | 2006/0267113 A1 | 11/2006 | Tobin et al. |
| 2004/0175882 A1 | 9/2004 | Ahn et al. | | 2006/0270147 A1 | 11/2006 | Ahn et al. |
| 2004/0178439 A1 | 9/2004 | Ahn et al. | | 2006/0281330 A1 | 12/2006 | Ahn et al. |
| 2004/0183108 A1 | 9/2004 | Ahn | | 2007/0007560 A1 | 1/2007 | Forbes et al. |
| 2004/0189175 A1 | 9/2004 | Ahn et al. | | 2007/0007635 A1 | 1/2007 | Forbes et al. |
| 2004/0196620 A1 | 10/2004 | Knudsen et al. | | 2007/0010060 A1 | 1/2007 | Forbes et al. |
| 2004/0198069 A1 | 10/2004 | Metzner et al. | | 2007/0010061 A1 | 1/2007 | Forbes et al. |
| 2004/0203254 A1 | 10/2004 | Conley, Jr. et al. | | 2007/0018214 A1 | 1/2007 | Ahn |
| 2004/0214399 A1 | 10/2004 | Ahn et al. | | 2007/0037415 A1 | 2/2007 | Ahn et al. |
| 2004/0219783 A1 | 11/2004 | Ahn et al. | | 2007/0045676 A1 | 3/2007 | Forbes et al. |
| 2004/0222476 A1 | 11/2004 | Ahn et al. | | 2007/0045752 A1 | 3/2007 | Forbes et al. |
| 2004/0233010 A1 | 11/2004 | Akram et al. | | 2007/0049023 A1 | 3/2007 | Ahn et al. |
| 2004/0235313 A1 | 11/2004 | Frank et al. | | 2007/0049051 A1 | 3/2007 | Ahn et al. |
| 2001/0050438 A1 | 12/2004 | Juengling et al. | | 2007/0049054 A1 | 3/2007 | Ahn et al. |
| 2004/0248398 A1 | 12/2004 | Ahn et al. | | 2007/0059881 A1 | 3/2007 | Ahn et al. |
| 2004/0262700 A1 | 12/2004 | Ahn et al. | | 2007/0087563 A1 | 4/2007 | Ahn et al. |
| 2004/0264236 A1 | 12/2004 | Chae et al. | | 2007/0090441 A1 | 4/2007 | Ahn et al. |
| 2004/0266217 A1 | 12/2004 | Kim et al. | | 2007/0092989 A1 | 4/2007 | Kraus et al. |
| 2005/0009370 A1 | 1/2005 | Ahn | | 2007/0099366 A1 | 5/2007 | Ahn et al. |
| 2005/0020017 A1 | 1/2005 | Ahn et al. | | 2007/0101929 A1 | 5/2007 | Ahn et al. |
| 2005/0023578 A1 | 2/2005 | Bhattacharyya | | 2007/0107661 A1 | 5/2007 | Ahn |
| 2005/0023594 A1 | 2/2005 | Ahn et al. | | 2007/0131169 A1 | 6/2007 | Ahn |
| 2005/0023603 A1 | 2/2005 | Eldridge et al. | | 2007/0141832 A1 | 6/2007 | Farrar |
| 2005/0023613 A1 | 2/2005 | Bhattacharyya | | 2007/0181931 A1 | 8/2007 | Ahn et al. |
| 2005/0023624 A1 | 2/2005 | Ahn et al. | | 2007/0187772 A1 | 8/2007 | Ahn et al. |
| 2005/0023625 A1 | 2/2005 | Ahn et al. | | 2007/0187831 A1 | 8/2007 | Ahn et al. |
| 2005/0023626 A1 | 2/2005 | Ahn et al. | | 2007/0234949 A1 | 10/2007 | Ahn et al. |
| 2005/0023627 A1 | 2/2005 | Ahn et al. | | | | |
| 2005/0026349 A1 | 2/2005 | Forbes et al. | | | FOREIGN PATENT DOCUMENTS | |
| 2005/0026458 A1 | 2/2005 | Basceri et al. | | | | |
| 2005/0029547 A1 | 2/2005 | Ahn et al. | | EP | 1122795 A2 | 8/2001 |
| 2005/0029604 A1 | 2/2005 | Ahn et al. | | EP | 1324376 | 7/2003 |
| 2005/0029605 A1 | 2/2005 | Ahn et al. | | EP | 1324376 A1 | 7/2003 |
| 2005/0030825 A1 | 2/2005 | Ahn | | JP | 62-199019 | 9/1987 |
| 2005/0032292 A1 | 2/2005 | Ahn et al. | | JP | 03028162 | 2/1991 |
| 2005/0037563 A1 | 2/2005 | Ahn | | JP | 5090169 | 4/1993 |
| 2005/0051828 A1 | 3/2005 | Park et al. | | JP | 07-320996 | 12/1995 |
| 2005/0054165 A1 | 3/2005 | Ahn et al. | | JP | 09-293845 | 11/1997 |
| 2005/0087134 A1 | 4/2005 | Ahn | | JP | 11-335849 | 12/1999 |
| 2005/0124174 A1 | 6/2005 | Ahn et al. | | JP | 2000192241 A * | 7/2000 |
| 2005/0140462 A1 | 6/2005 | Akram et al. | | JP | 2001-332546 | 11/2001 |
| 2005/0145957 A1 | 7/2005 | Ahn et al. | | WO | WO-01/97257 | 12/2001 |

| | | |
|---|---|---|
| WO | WO-02/31875 | 4/2002 |
| WO | WO-0233729 A2 | 4/2002 |
| WO | WO-0243115 | 5/2002 |
| WO | WO-04079796 A3 | 9/2004 |
| WO | WO-2006026716 | 3/2006 |
| WO | WO-2006026716 A1 | 3/2006 |

OTHER PUBLICATIONS

U.S. Appl. No. 10/137,499, filed May 2, 2002, Atomic Layer-Deposited LaAlO3 Films for Gate Dielectrics.

U.S. Appl. No. 10/163,481, Jun. 5, 2002, Atomic Layer-Deposited HfAlO3 Films for Gate Dielectrics.

U.S. Appl. No. 10/229,903, filed Aug. 28, 2002, Atomic Layer Deposited HfSiON Dielectric Films.

U.S. Appl. No. 10/233,309, filed Aug. 29, 2002, Atomic Layer Deposited Lanthanide Doped TiOX Dielectric Films.

U.S. Appl. No. 10/309,583, Dec. 4, 2002, Atomic Layer Deposited ZR-SN-TI-O Films Using TiI4.

U.S. Appl. No. 10/309,935, filed Dec. 4, 2002, Atomic Layer Deposited Zr-Sn-Ti-O Films.

U.S. Appl. No. 10/379,470, filed Mar. 4, 2003, Atomic Layer Deposited Dielectric Layers.

U.S. Appl. No. 10/403,734, filed Mar. 31, 2003, Atomic Layer Deposited ZrAlxOy Dielectric Layers.

U.S. Appl. No. 10/420,307, filed Apr. 22, 2003, Atomic Layer Deposited ZrTiO4 Films.

U.S. Appl. No. 10/602,323, filed Jun. 24, 2003, Lanthanide Oxide/Hafnium Oxide Dielectric Layers.

U.S. Appl. No. 10/789,042, filed Feb. 27, 2004, Atomic Layer-Deposited LaAlO3 Films for Gate Dielectrics.

U.S. Appl. No. 10/909,959, filed Aug. 2, 2004, Atomic Layer Deposition of Zirconium-Doped Tantalum Oxide Films.

U.S. Appl. No. 10/931,533, filed Aug. 31, 2004, Atomic Layer Deposited Titanium Aluminum Oxide Films.

U.S. Appl. No. 10/926,812, filed Aug. 26, 2004, Ruthenium Gate for a Lanthanide Oxide Dielectric Layer.

U.S. Appl. No. 10/930,167, filed Aug. 31, 2004, Atomic Layer Deposited Lanthanum Aluminum Oxide Dielectric Layer.

U.S. Appl. No. 10/930,516, filed Aug. 31, 2004, Atomic Layer Deposited HfSiON Dielectric Films.

U.S. Appl. No. 10/931,341, filed Aug. 31, 2004, Atomic Layer Deposited ZR-SN-TI-O Films Using TiI4.

U.S. Appl. No. 10/930,431, filed Aug. 31, 2004, Atomic Layer-Deposited HfAlO3 Films for Gate Dielectrics.

U.S. Appl. No. 10/931,364, filed Aug. 31, 2004, Lanthanide Doped TiOx Dielectric Films by Plasma Oxidation.

U.S. Appl. No. 10/931,343, filed Aug. 31, 2004, Lanthanide Oxide/Hafnium Oxide Dielectric Layers.

U.S. Appl. No. 10/931,845, filed Aug. 31, 2004, Methods, Systems, and Apparatus for Uniform Chemical-Vapor Depositions.

U.S. Appl. No. 11/010,529, filed Dec. 13, 2004, Atomic Layer Deposited Lanthanum Hafnium Oxide Dielectrics.

U.S. Appl. No. 11/029,757, filed Jan. 5, 2005, Atomic Layer Deposited Hafnium Tantalum Oxide Dielectrics.

U.S. Appl. No. 11/031,289, filed Jan. 7, 2005, Lanthanide Doped TiOx Dielectric Films by Plasma Oxidation.

U.S. Appl. No. 11/093,104, filed Mar. 29, 2005, Atomic Layer Deposited Titanium Silicon Oxide Films.

U.S. Appl. No. 11/117,121, filed Apr. 28, 2005, Atomic Layer Deposited Zirconium Silicon Oxide Films.

U.S. Appl. No. 11/117,125, filed Apr. 28, 2005, Atomic Layer Deposition of a Ruthenium Layer to a Lanthanide Oxide Dielectric Layer.

U.S. Appl. No. 11/084,968, filed Mar. 21, 2005, Zr-Sn-Ti-O Films.

U.S. Appl. No. 11/148,505, filed Jun. 9, 2005, Atomic Layer Deposited Nanolaminates of HfO2/ZrO2 Films as Gate Dielectrics.

Chin, A., et al., "High Quality La2O3 and Al2O3 Gate Dielectrics with Equivalent Oxide Thickness 5-10A", *Digest of Technical Papers. 2000 Symposium on VLSI Technology*, 2000, Honolulu,(Jun. 13-15, 2000), 16-17.

Copel, M., et al., "Formation of a stratified lanthanum silicate dielectric by reaction with Si(001)", *Applied Physics Letters*, 78(11), (Mar. 12, 2001),1607-1609.

Dimoulas, A., et al., "Structural and electrical quality of the high-k dielectric Y2O3 on Si (001): Dependence on growth parameters", *Journal of Applied Physics*, 92(1), (Jul. 1, 2002),426-431.

Guha, S, et al., "Atomic beam deposition of lanthanum-and yttrium-based oxide thin films for gate dielectrics", *Applied Physics Letters*, 77, (2000),2710-2712.

Guha, S., et al., "High temperature stability of Al2O3 dielectrics on Si: Interfacial metal diffusion and mobility degradation", *Applied Physics Letters*, vol. 81, No. 16, (Oct. 14, 2002),2956-2958.

Hoshino, Y., et al., "Characterization and Control of the HfO2/Si(001) Interfaces", *Applied Physics Letters*, 81, (Sep. 30, 2002),2650-2652.

Huang, C. H., et al., "La/sub 2/O/sub 3//Si/sub 0.3/Ge/sub 0.7/ p-MOSFETs with high hole mobility and good device characteristics", *IEEE Electron Device Letters*, 23(12), (Dec. 2002),710-712.

Iwai, H., et al., "Advanced gate dielectric materials for sub-100 nm CMOS", *International Electron Devices Meeting*, 2002. IEDM '02. Digest., (Dec. 8-11, 2002),625-628.

Ko, Myoung-Gyun, et al., "High density plasma enhanced atomic layer deposition of lanthanum oxide for high-k gate oxide material", *207th Meeting of the Electrochemical Society*, (May 2005),1 page.

Kwo, J., et al., "High E gate dielectrics Gd2O3 and Y2O3 for silicon", *Applied Physics Letters*, 77(1), (Jul. 3, 2000),130-132.

Maria, J. P., et al., "High temperature stability in lanthanum and zirconia-based gate dielectrics", *Journal of Applied Physics*, 90(7), (Oct. 1, 2001),3476-3482.

Michaelson, Herbert B., "The work function of the elements and its periodicity", *Journal of Applied Physics*, 48(11), (Nov. 1977),4729-4733.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003),L1315-L1317.

Tewg, J.Y., et al., "Electrical and Physical Characterization of Zirconium-Doped Tantalum Oxide Films", *Electrochemical Society Proceedings*, vol. 2002-28, (2002),75-81.

Yamada, Hirotoshi, et al., "MOCVD of High-Dielectric-Constant Lanthanum Oxide Thin Films", *Journal of The Electrochemical Society*, 150(8), (Aug. 2003),G429-G435.

Zhong, Huicai, et al., "Electrical Properties of Ru and RuO2 Gate Electrodes for Si-PMOSFET with ZrO2 and Zr-Silicate Dielectrics", *Journal of Electronic Materials*, 30(12), (Dec. 2001),1493-1498.

PCT Search Report dated Oct. 15, 2003 for application PCT/US 03/17730 completed by S. Nesso.

"Improved Metallurgy for Wiring Very Large Scale Integrated Circuits", *International Technology Disclosures*, 4, Abstract,(1986), 1 page.

Aarik, Jaan, et al., "Atomic layer growth of epitaxial TiO/sub 2/ thin films from TiCl/sub 4/ and H/sub 2/O on alpha-Al/sub 2/O/sub 3/ substrates", *Journal of Crystal Growth*, 242(1-2), (2002), 189-198.

Aarik, Jaan, et al., "Influence of substrate temperature on atomic layer growth and properties of HfO/sub 2/ thin films", *Thin Solid Films*, 340(1-2), (1999),110-116.

Aarik, Jaan, et al., "Phase transformations in hafnium dioxide thin films grown by atomic layer doposition at high temperatures", *Applied Surface Science*, 173(1-2), (Mar. 2001),15-21.

Aarik, Jaan, et al., "Texture development in nanocrystalline hafnium dioxide thin films grown by atomic layer deposition", *Journal of Crystal Growth*, 220(1-2), (Nov. 15, 2000),105-113.

Abe, T, "Silicon Wafer-Bonding Process Technology for SOI Structures", *Extended Abstracts of the 22nd (1990 International) Conference on Solid State Devices and Materials*, (1990),853-856.

Adler, E., et al., "The Evolution of IBM CMOS DRAM Technology", *IBM Journal of Research & Development*, 39(1-2), (Jan.-Mar. 1995),167-188.

Ahn, Kie Y., et al., "Highly Reliable Amorphous High-K Gate Oxide ZrO2", *Micron*, (May 17, 2001),3 pages.

Alen, Petra, "Atomic Layer deposition of Ta(Al)N(C) thin films using trimethylaluminum as a reducing agent", *Journal of the Electrochemical Society*, 148(10), (Oct. 2001),G566-G571.

Asai, S., "Technology Challenges for Integration Near and Below 0.1 micrometer", *Proceedings of the IEEE*, 85(4), Special Issue on Nanometer-Scale Science & Technology,(Apr. 1997),505-520.

Auberton-Herve, A. J., "SOI: Materials to Systems", *Digest of the International Electron Device Meeting*, San Francisco,(Dec. 1996),3-10.

Banerjee, S. K., et al., "Characterization of Trench Transistors for 3-D Memories", *1986 Symposium on VLSI Technology, Digest of Technical Papers*, San Diego, CA,(May 1986),79-80.

Bendoraitis, J G., et al., "Optical energy gaps in the monoclinic oxides of hafnium and zirconium and their solid solutions", *Journal of Physical Chemistry*, 69(10), (1965),3666-3667.

Bengtsson, Stefan, et al., "Interface charge control of directly bonded silicon structures", *J. Appl. Phys.*, 66(3), (Aug. 1989),1231-1239.

Blalock, T. N., et al., "A High-Speed Sensing Scheme for 1T Dynamic RAM's Utilizing the Clamped Bit-Line Sense Amplifier", *IEEE Journal of Solid-State Circuits*, 27(4), (Apr. 1992),pp. 618-624.

Bomchil, G., "Porous Silicon: The Material and its Applications in Silicon-On-Insulator Technologies", *Applied Surface Science*, 41/42, (1989),604-613.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991),619-621.

Bunshah, Rointan F., et al., "Deposition Technologies for Films and Coatings: Developments and Applications", *Park Ridge, N.J., U.S.A.: Noves Publications*, (1982),102-103.

Burnett, D., "Implications of Fundamental Threshold Voltage Variations for High-Density SRAM and Logic Circuits", *1994 Symposium on VLSI Technology, Digest of Technical Papers*, Honolulu, HI,(Jun. 1994),15-16.

Burnett, D., "Statistical Threshold-Voltage Variation and its Impact on Supply-Voltage Scaling", *Proceedings SPIE: Microelectronic Device and Multilevel Interconnection Technology*, 2636, (1995),83-90.

Callegari, A., et al., "Physical and electrical characterization of Hafnium oxide and Hafnium silicate sputtered films", *Journal of Applied Physics*, 90(12), (Dec. 15, 2001),6466-75.

Cartagena, E, "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ,(1993),1199-1200.

Cava, R J., "Improvement of the dielectric properties of Ta/sub 2/O/sub 5/ through substitution with Al/sub 2/O/sub 3/", *Applied Physics Letters*, 70(11), (Mar. 1997),1396-8.

Chang, Hyo S., et al., "Excellent thermal stability of Al2O3/ZrO2/Al2O3 stack structure of metal-oxide-semiconductor gate dielectrics application", *Applied Physics Letters*, 80(18), (May 6, 2002),3385-7.

Chen, M. J., et al., "Back-Gate Forward Bias Method for Low-Voltage CMOS Digital Cicuits", *IEEE Transactions on Electron Devices*, 43, (Jun. 1996),904-909.

Chen, M. J., et al., "Optimizing the Match in Weakly Inverted MOSFET's by Gated Lateral Bipolar Action", *IEEE Transactions on Electron Devices*, 43, (May 1996),766-773.

Chen, P. J., et al., "Thermal stability ans scalability of Zr-aluminate-based high-k gate stacks", *Symposium on VLSI Technology Digest*, (2002),192-3.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999),1537-1544.

Chesler, R., et al., "Solid-State Ionic Lasers", *In: Laser Handbook*, vol. 1, Arecchi, F.T., et al., (eds.), North-Holland Publishing Company, Amsterdam,(1972),p. 353.

Chung, I. Y., et al., "A New SOI Inverter for Low Power Applications", *Proceedings of the 1996 IEEE International SOI Conference*, Sanibel Island, FL,(1996),20-21.

Clark, P, "IMEC Highlights Hafnium, Metal Gates for High-k Integration", *Semiconductor Business News*, at Silicon Strategies.com,(Oct. 11, 2002),2 pages.

Colombo, D., et al., "Anhydrous Metal Nitrates as Volatile Single Source Precursors for the CVD of Metal Oxide Films", *Communications, Department of EE, U of M, Mpls*, MN, (Jul. 7, 1998),3 pages.

Conley Jr., J F., et al., "Atomic Layer Deposition of Hafnium Oxide Using Anhydrous Hafnium Nitrate", *Electrochemical and Solid State Letters*, 5(5), (2002),C57-C59.

Copel, M., "Structure and stability of ultrathin zirconium oxide layers on Si(001)", *Applied Physics Letters*, 76(4), (Jan. 2000),436-438.

Da Rosa, E B., et al., "Annealing of ZrAl/sub x/O/sub y/ ultrathin films on Si in a vacuum or in O/sub 2/", *Journal of the Electrochemical Society*, 148 (12), (Dec. 2001),G695-G703.

De, V. K., "Random MOSFET Parameter Fluctuation Limits to Gigascale Integration (GSI)", *1996 Symposium on VLSI Technology, Digest of Technical Papers*, Honolulu, HI,(Jun. 11-13, 1996),198-199.

De Flaviis, Franco, et al., "Planar microwave integrated phase-shifter design with high purity ferroelectric material", *IEEE Transactions on Microwave Theory & Techniques*, 45(6), (Jun. 1997),963-969.

Denton, J. P., et al., "Fully Depleted Dual-Gated Thin-Film SOI P-MOSFET's Fabricated in SOI Islands with an Isolated Buried Polysilicon Backgate", *IEEE Electron Device Letters*, 17(11), (Nov. 1996),pp. 509-511.

Desu, S B., "Minimization of Fatigue in Ferroelectric Films", *Physica Status Solidi A*, 151(2), (1995),467-480.

Ding, "Copper Barrier, Seed Layer and Planerization Technologies", *VMIC Conference Proceedings*, (1997),87-92.

Dusco, C, et al., "Deposition of tin oxide into porous silicon by atomic layer epitaxy", *Journal of the Electrochemical Society*, 143, (1996),683-687.

El-Kareh, B, et al., "The evolution of DRAM cell technology", *Solid State Technology*, 40(5), (1997),89-90, 92, 95-6, 98, 100-1.

Engelhardt, M., "Modern Applications of Plasma Etching and Patterning in Silicon Process Technology", *Contributions to Plasma Physics*, 39(5), (1999),473-478.

Fong, Y., "Oxides Grown on Textured Single-Crystal Silicon—Dependence on Process and Application in EEPROMs", *IEEE Transactions on Electron Devices*, 37(3), (Mar. 1990),pp. 583-590.

Forbes, L., et al., "Resonant Forward-Biased Guard-Ring Diodes for Suppression of Substrate Noise in Mixed-Mode CMOS Circuits", *Electronics Letters*, 31, (Apr. 1995),720-721.

Forsgren, Katarina, "Atomic Layer Deposition of HFO2 using hafnium iodide", *Conference held in Monterey, California*, (May 2001),1 page.

Forsgren, Katarina, "CVD and ALD of Group IV- and V-Oxides for Dielectric Applications", *Comprehensive Summaries of Uppsala Dissertation from the Faculty of Science and Techonology*, 665, (2001).

Foster, R., et al., "High Rate Low-Temperature Selective Tungsten", *In: Tungsten and Other Refractory Metals for VLSI Applications III*, V.A. Wells ed., Materials Res. Soc., Pittsburgh, PA,(1988),69-72.

Fuse, T., "A 0.5V 200MHz 1-Stage 32b ALU Using a Body Bias Controlled SOI Pass-Gate Logic", *1997 IEEE International Solid-State Circuits Conference, Digest of Technical Papers*, (1997),286-287.

Fuyuki, Takashi, et al., "Electronic Properties of the Interface between Si and TiO2 Deposited at Very Low Temperatures", *Japanese Journal of Applied Physics, Part (Regular Papers & Short Notes)*, 25,(9), (Sep. 1986),1288-1291.

Fuyuki, Takashi, et al., "Initial stage of ultra-thin SiO/sub 2/ formation at low temperatures using activated oxygen", *Applied Surface Science*, 117-118, (Jun. 1997),123-126.

Gagliano, F. P., et al., "Laser Processing Fundamentals", *In Lasers in Industry*, edited by S.S. Charschan, Van Nostrand Reinhold Company,(1972),156-164.

Gartner, M., et al., "Spectroellipsometric characterization of lanthanide-doped TiO/sub 2/ films obtained via the sol-gel technique", *Thin Solid Films*, 234(1-2), (1993),561-565.

Geller, S., et al., "Crystallographic Studies of Perovskite-like Compounds. II. Rare Earth Aluminates", *Acta Cryst.*, 9, (May 1956),1019-1025.

Geiss, E. A., et al., "Lanthanide gallate perovskite-type substrates for epitaxial, high-T/sub c/ superconducting Ba/sub 2/YCu/sub 3/O/sub 7- delta / films", *IBM Journal of Research and Development*, 34(6), (Nov. 1990),916-926.

Gong, S., "Techniques for reducing switching noise in high speed digital systems", *Proceedings Eighth Annual IEEE International ASIC Conference and Exhibit*, (1995),21-24.

Gosele, U., et al., "Self-propagating Room-temperature Silicon Wafer Bonding in Ultrahigh Vacuum", *Applied Physics Letters*, 67(24), (Dec. 11, 1995),3614-3616.

Guillaumot, B., et al., "75 nm damascene metal gate and high-k integration for advanced CMOS devices", *Technical Digest of International Electron Devices Meeting 2002*, (2002),355-358.

Gusev, E P., et al., "Ultrathin High-K Dielectrics Grown by Atomic Layer Deposition: A Comparative Study of $ZrO_2$, $HfO_2$, $Y_2O_3$ and $Al_2O_3$", *Electrochemical Society Proceedings* vol. 2001-9, (2001),189-195.

Gutowski, M J., "Thermodynamic stability of high-K dielectric metal oxides $ZrO_2$ and $HfO_2$ in contact with Si and $SiO_2$/", *Applied Physics Letters*, 80(11), (Mar. 18, 2002),1897-1899.

Hao, M. Y., "Electrical Characteristics of Oxynitrides Grown on Textured Single-Crystal Silicon", *Appl. Phys. Lett.*, 60, (Jan. 1992),445-447.

Harada, M., "Suppression of Threshold Voltage Variation in MTCMOS/SIMOX Circuit Operating Below 0.5 V", *1996 Symposium on VLSI Technology, Digest of Technical Papers*, Honolulu, HI,(Jun. 11-13, 1996),96-97.

Harendt, Christine, "Silicon on Insulator Material by Wafer Bonding", *Journal of Electronic Materials* 20(3), (Mar. 1991),267-77.

Hayashi, H., et al., "Fabrication of Low-temperature bottom-gate Poly-Si TFTs on large-area substrate by linear-beam excimer laser crystallization and ion doping method", *IEEE IEDM*, vol. 95, (1995),829-832.

Heavens, O., *Optical Properties of Thin Solid Films*, Dover Pubs. Inc., New York,(1965),155-206.

Hirayama, Masaki, et al., "Low-Temperature Growth of High-Integrity Silicon Oxide Films by Oxygen Radical Generated in High Density Krypton Plasma", *International Electron Devices Meeting 1999. Technical Digest*, (1999),249-252.

Hisamoto, D., et al., "A New Stacked Cell Structure for Giga-Bit DRAMs using Vertical Ultra-Thin SOI (DELTA) MOSFETs", *1991 IEEE International Electron Devices Meeting, Technical Digest, Technical Digest*, Washington, D.C.,(Dec. 8-11, 1991),959-961.

Hodges, David A., et al., "MOS Decoders", *In: Analysis and Design of Digital Integrated Circuits*, 2nd Edition, Section: 9.1.3,(1988),354-357.

Holman, W. T., et al., "A Compact Low Noise Operational Amplifier for a 1.2 Micrometer Digital CMOS Technology", *IEEE Journal of Solid-State Circuits*, 30, (Jun. 1995),710-714.

Horiuchi, M, et al., "A mechanism of silicon wafer bonding", *of the First International Symposium on Semiconductor Wafer Bonding: Science, Technology and Applications*, (1992),48-62.

Hu, G., "Will Flash Memory Replace Hard Disk Drive?", *1994 IEEE International Electron Device Meeting*, Panel Discussion, Session 24, Outline,(Dec. 1994),2 pages.

Huang, W. L., et al., "TFSOI Complementary BiCMOS Technology for Low Power Applications", *IEEE Transactions on Electron Devices*, 42, (Mar. 1995),506-512.

Hubbard, K. J., "Thermodynamic stability of binary oxides in contact with silicon", *Journal of Materials Research*, 11(11), (Nov. 1996),2757-2776.

Hunt, C. E., et al., "Direct bonding of micromachined silicon wafers for laser diode heat exchanger applications", *Journal of Micromechanics and Microengineering*, 1(3), (Sep. 1991),152-156.

Iddles, D M., et al., "Relationships between dopants, microstructure and the microwave dielectric properties of $ZrO_2$-$TiO_2$-$SnO_2$ ceramics", *Journal of Materials Science*, 27(23), (Dec. 1992),6303-6310.

Iijima, T., "Microstructure and Electrical Properties of Amorphous W-Si-N Barrier Layer for Cu Interconnections", *1996 VMIC Conference*, (1996),168-173.

Imthurn, George P., et al., "Bonded Silicon-on-Sapphire Wafers and Devices", *Journal of Applied Physics*, 72(6), (Sep.1992),2526-7.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001),471-474.

Jeon, Sanghun, et al., "Ultrathin nitrided-nanolaminate ($Al_2O_3$/$ZrO_2$/$Al_2O_3$) for metal?oxide?semiconductor gate dielectric applications", *Journal of Vacuum Science & Technology B: Microelectronics and Nanometer Structures*, 20(3), (May 2002),1143-5.

Jeong, Chang-Wook, et al., "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001),285-289.

Jun, Y. K., "The Fabrication and Electrical Properties of Modulated Stacked Capacitor for Advanced DRAM Applications", *IEEE Electron Device Letters*, 13, (Aug. 1992),430-432.

Jung, T. S., "A 117-mm2 3.3-V Only 128-Mb Multilevel NAND Flash Memory for Mass Storage Applications", *IEEE Journal of Solid-State Circuits*, 31, (Nov. 1996),1575-1583.

Jung, H S., et al., "Improved current performance of CMOSFETs with nitrogen incorporated $HfO_2$-$Al_2O_3$ laminate gate dielectric", *Technical Digest of International Electron Devices Meeting 2002*, (2002),853-856.

Kang, H. K., et al., "Highly Manufacturable Process Technology for Reliable 256 Mbit and 1Gbit DRAMs", *IEEE International Electron Devices Meeting, Technical Digest*, San Francisco, CA,(Dec. 11-14, 1994),635-638.

Kang, L, et al., "MOSFET devices with polysilicon on single-layer $HfO_2$/ high-k dielectrics", *International Electron Devices Meeting 2000. Technical Digest. IEDM*, (2000),35-8.

Kawai, Y, et al., "Ultra-low temperature growth of high-integrity gate oxide films by low-energy Ion-assisted oxidation", *Applied Physics Letters*, 64(17), (Apr. 1994),2223-2225.

Keomany, D., et al., "Sol gel preparation of mixed cerium-titanium oxide thin films", *Solar Energy Materials and Solar Cells*, 33(4), (Aug. 1994),429-441.

Kim, Y W., et al., "50nm gate length logic technology with 9-layer Cu interconnects for 90nm node SoC applications", *Technical Digest of International Electron Devices Meeting 2002*, (2002),69-72.

Kim, Y. S., "Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA,(1996),675-680.

Kim, C T., et al., "Application of $Al_2O_3$ Grown by Atomic Layer Deposition to DRAM and FeRAM", *International Symposium in Integrated Ferroelectrics*, (Mar. 2000),316.

Kim, D., et al., "Atomic Control of Substrate Termination and Heteroepitaxial Growth of $SrTiO_3$/$LaAlO_3$ Films", *Journal of the Korean Physical Society*, 36(6), (Jun. 2000),444-448.

Kim, Byoung-Youp, et al., "Comparison study for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kim, Taeseok, et al., "Correlation between strain and dielectric properties in $ZrTiO_4$/ thin films", *Applied Physics Letters*, 76(21), (May 2000),3043-3045.

Kim, Taeseok, et al., "Dielectric properties and strain analysis in paraelectric $ZrTiO_4$/ thin films deposited by DC magnetron sputtering", *Japanese Journal of Applied Physics Part 1-Regular Papers Short Notes & Review Papers*, 39(7A), (2000),4153-4157.

Kim, Yongjo, et al., "Effect of microstructures on the microwave dielectric properties of $ZrTiO_4$/ thin films", *Applied Physics Letters*, 78(16), (Apr. 16, 2001),2363-2365.

Kim, Y, et al., "Substrate dependence on the optical properties of $Al_2O_3$/ films grown by atomic layer deposition", *Applied Physics Letters*, 71(25, 22 ), (Dec. 1997),3604-3606.

Kishimoto, T., et al., "Well Structure by High-Energy Boron Implantation for Soft-Error Reduction in Dynamic Random Access Memories (DRAMs)", *Japanese Journal of Applied Physics*, 34, (Dec. 1995),6899-6902.

Kohyama, Y., et al., "Buried Bit-Line Cell for 64MB DRAMs", *1990 Symposium on VLSI Technology, Digest of Technical Papers*, Honolulu, HI,(Jun. 4-7, 1990),17-18.

Koshida, N., "Efficient Visible Photoluminescence from Porous Silicon", *Japanese Journal of Applied Physics*, 30, (Jul. 1991),L1221-L1223.

Krauter, G., et al., "Room Temperature Silicon Wafer Bonding with Ultra-Thin Polymer Films", *Advanced Materials*, 9(5), (1997),417-420.

Kuge, S., et al., "SOI-DRAM Circuit Technologies for Low Power High Speed Multigiga Scale Memories", *IEEE Journal of Solid-State Circuits*, 31(4), (Apr. 1996),pp. 586-591.

Kukli, Kaupo, "Atomic Layer Deposition of Titanium Oxide from TiI4 and H2O2", *Chemical Vapor Deposition*, 6(6), (2000),303-310.

Kukli, K, "Comparison of hafnium oxide films grown by atomic layer deposition from iodide and chloride precursors", *Thin Solid Films*, 416, (2002),72-79.

Kukli, K, et al., "Controlled growth of yttrium oxysulphide thin films by atomic layer deposition", *Materials Science Forum*, 315-317, (1999),216-221.

Kukli, Kaupo, "Dielectric Properties of Zirconium Oxide Grown by Atomic Layer Deposition from Iodide Precursor", *Journal of The Electrochemical Society*, 148(12), (2001),F227-F232.

Kukli, Kaupo, et al., "Influence of thickness and growth temperature on the properties of zirconium oxide films growth by atomic layer deposition on silicon", *Thin Solid Films*, 410(1-2), (2002),53-60.

Kukli, Kaupo, et al., "Low-Temperature Deposition of Zirconium Oxide-Based Nanocrystalline Films by Alternate Supply of Zr[OC(CH3)3]4 and H2O", *Chemical Vapor Deposition*, 6(6), (2000),297-302.

Kukli, K J., et al., "Properties of hafnium oxide films grown by atomic layer deposition from hafnium tetraiodide and oxygen", *Journal of Applied Physics*, 92(10), (Nov. 15, 2002),5698-5703.

Lantz, II, L., "Soft Errors Induced By Alpha Particles", *IEEE Transactions on Reliability*, 45, (Jun. 1996),174-179.

Lasky, J. B., "Wafer Bonding for Silicon-on-Insulator Technologies", *Applied Physics Letters*, 48(1), (Jan. 6, 1986),78-80.

Lee, Byoung H., et al., "Characteristics of TaN gate MOSFET with ultrathin hafnium oxide (8 A-12 A)", *Electron Devices Meeting, 2000. IEDM Technical Digest. International*, (2000),39-42.

Lee, A E., et al., "Epitaxially grown sputtered LaAlO3 films", *Applied Physics Letters*, 57(19), (Nov. 1990),2019-2021.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002),2807-09.

Lee, S J., et al., "High quality ultra thin CVD HfO2 gate stack with poly-Si gate electrode", *Electron Devices Meeting, 2000. IEDM Technical Digest. International*, (2000),31-34.

Lee, Cheng-Chung, et al., "Ion-assisted deposition of silver thin films", *Thin Solid Films*, 359(1), (Jan. 2000),95-97.

Lee, Jung-Hyoung, et al., "Mass production worthy HfO/sub 2/-Al/sub 2/O/sub 3/ laminate capacitor technology using Hf liquid precursor for sub-100 nm DRAMs", *Electron Devices Meeting, 2002. IEDM '02. Digest. International*, (2002),221-224.

Lee, Dong H., et al., "Metalorganic chemical vapor deposition of TiO/sub 2/:N anatase thin film on Si substrate", *Applied Physics Letters*, 66(7), (Feb. 1995),815-816.

Lee, L P., "Monolithic 77 K dc SQUID magnetometer", *Applied Physics Letters*, 59(23), (Dec. 1991),3051-3053.

Lee, C. H., et al., "MOS Characteristics of Ultra Thin Rapid Thermal CVD ZrO2 and Zr Silicate Gate Dielectrics", *Electron Devices Meeting, 2000. IEDM Technical Digest. International*, (2000),27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001),137-138.

Lee, B. H., et al., "Novel Pattern Transfer Process for Bonded SOI Giga-bit DRAMs", *IEEE International SOI Conference*, Piscataway, NJ,(1996),114-115.

Lee, Byoung H., et al., "Ultrathin Hafnium Oxide with Low Leakage and Excellent Reliability for Alternative Gate Dielectric Application", *Technical Digest of IEDM*, (1999),133-136.

Lehmann, V., "The Physics of Macropore Formation in Low Doped n-Type Silicon", *Journal of the Electrochemical Society*, 140(10), (Oct. 1993),2836-2843.

Leskela, M, et al., "ALD precursor chemistry: Evolution and future challenges", *Journal de Physique IV (Proceedings)*, 9(8), (Sep. 1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999),1911-1915.

Lu, D, , "Bonding Silicon Wafers by Use of Electrostatic Fields Followed by Rapid Thermal Heating", *Materials Letters*, 4(11), (Oct. 1986),461-464.

Lu, N., et al., "The SPT Cell—A New Substrate-Plate Trench Cell for DRAMs"*1985 IEEE International Electron Devices Meeting, Technical Digest*, Washington, D.C.,(Dec. 1-4, 1985),771-772.

Lucovsky, G, et al., "Microscopic model for enhanced dielectric constants in low concentration SiO/sub 2/-rich noncrystalline Zr and Hf silicate alloys", *Applied Physics Letters*, 77(18), (Oct. 2000),2912-2914.

Luo, Z J., et al., "Ultra-thin ZrO2 (or Silicate) with High Thermal Stability for CMOS GAte Applications", *2001 Symposium on VLSI Technology Digest of Technical Papers*, (2001),135-136.

Macsweeney, D., et al., "Modelling of Lateral Bipolar Devices in a CMOS Process", *IEEE Bipolar Circuits and Technology Meeting*Minneapolis, MN,(Sep. 1996),27-30.

Maeda, S., et al., "A Vertical Phi-Shape Transistor (VPhiT) Cell for 1 Gbit DRAM and Beyond", *1994 Symposium of VLSI Technology, Digest of Technical Papers*, Honolulu, HI,(Jun. 7-9, 1994),133-134.

Maeda, S., et al., "Impact of a Vertical Phi-Shape Transistor (VPhiT) Cell for 1 Gbit DRAM and Beyond", *IEEE Transactions on Electron Devices*, 42, (Dec. 1995),2117-2123.

Malaviya, S., *IBM TBD*, 15, (Jul. 1972),p. 42.

Martin, P J., et al., "Ion-beam-assisted deposition of thin films", *Applied Optics*, 22(1), (Jan. 1983),178-184.

Masu, K., et al., "Multilevel Metallization Based on Al CVD", *1996 IEEE Symposium on VLSI Technology, Digest of Technical Papers*, Honolulu, HI,(Jun. 11-13, 1996),44-45.

McCredie, B. D., et al., "Modeling, Measurement, and Simulation of Simultaneous Switching Noise", *IEEE Transactions on Components, Packaging, and Manufacturing Technology—Part B*, 19, (Aug. 1996),461-472.

Molodyk, A A., et al., "Volatile Surfactant-Assisted MOCVD: Application to LaAl03 Thin Film Growth", *Chemical Vapor Deposition*, 6(3), (Jun. 2000),133-138.

Molsa, Heini, et al., "Growth of yttrium oxide thin films from beta-diketonate precursor", *Advanced Materials for Optics and Electronics*, 4(6), (Nov.-Dec. 1994),389-400.

Muller, D A., "The electronic structure at the atomic scale of ultrathin gate oxides", *Nature*, (Jun. 1999),752-754.

Muller, D. A., "The electronic structure at the atomic scale of ultrathin gate oxides", *Nature*, 399(6738), (Jun. 24, 1999),758-61.

Mumola, P. B., et al., "Recent Advances in Thinning of Bonded SOI Wafers by Plasma Assisted Chemical Etching", *Electrochemical Society Proceedings*, 95-7, (1995),28-32.

Nakagawara, Osamu, et al., "Electrical properties of (Zr, Sn)TiO4 dielectric thin film prepared by pulsed laser deposition", *Journal of Applied Physics*, 80(1), (Jul. 1996),388-392.

Nakajima, Anri, et al., "Atomic-layer deposition of ZrO/sub 2/ with a Si nitride barrier layer", *Applied Physics Letters*, 81(15), (Oct. 2002),2824-2826.

Nakajima, Anri, et al., "NH/sub 3/-annealed atomic-layer-deposited silicon nitride as a high-k gate dielectric with high reliability", *Applied Physics Letters*, 80(7), (Feb. 2002),1252-1254.

Nakajima, Anri, "Soft breakdown free atomic-layer-deposited silicon-nitride/SiO/sub 2/ stack gate dielectrics", *International Electron Devices Meeting. Technical Digest*, (2001),6.5.1-4.

Nakamura, et al., "Giga-bit DRAM Cells with Low Capacitance and Low Resistance Bit-Lines on Buried MOSFET's and Capacitors by Using Bonded SOI Technology—Reversed-Stacked-Capacitor (RSTC) Cell-", *Technical Digest—International Electron Devices Meeting*, (1995),889-892.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.

Nieminen, Minna, et al., "Formation and stability of lanthanum oxide thin films deposited from B-diketonate precursor", *Applied Surface Science*, 174(2), (Apr. 16, 2001),155-165.

Niilisk, A., "Atomic-scale optical monitoring of the initial growth of TiO2 thin films", *Proceedings of the SPIE—The International Society for Optical Engineering*, 4318, (2001),72-77.

Nitayama, A., et al., "High Speed and Compact CMOS Circuits with Multipillar Surrounding Gate Transistors", *IEEE Transactions on Electron Devices*36, (Nov. 1989),2605-2606.

Oates, D E., et al., "Surface impedance measurements of YBa/sub 2/Cu/sub 3/O/sub 7-x/ thin films in stripline resonators", *IEEE Transactions on Magnetics*, vol. 27, No. 2, pt. 2. (Mar. 1991),867-871.

Oh, C B., et al., "Manufacturable embedded CMOS 6T-SRAM technology with high-k gate dielectric device for system-on-chip applications", *Technical Digest of International Electron Devices Meeting 2002*, (2002),423-426.

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA,(1987),59-66.

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA,(1989),17-25.

Ohno, Y., et al., "Estimation of the Charge Collection for the Soft-Error Immunity by the 3D-Devices Simulation and the Quantitative Investigation", *Simulation of Semiconductor Device and Processes*, 6, (Sep. 1995),302-305.

Ohring, Milton, "The Materials Science of Thin Films", *Boston : Academic Press*, (1992),118,121,125.

Oowaki, Y., et al., "New alpha-Particle Induced Soft Error Mechanism in a Three Dimensional Capacitor Cell", *IEICE Transactions on Electronics*, 78-C, (Jul. 1995),845-851.

Oshida, S., et al., "Minority Carrier Collection in 256 M-bit DRAM Cell on Incidence of Alpha-Particle Analyzed by Three-Dimensional Device Simulation", *IEICE Transactions on Electronics*, 76-C, (Nov. 1993),1604-1610.

Osten, H. J., et al., "High-k gate dielectrics with ultra-low leakage current based on praseodymium oxide", *International Electron Devices Meeting 2000. Technical Digest. IEDM*, (2000),653-656.

Ozaki, T., et al., "A Surrounding Isolation-Merged Plate Electrode (SIMPLE) Cell with Checkered Layout for 256Mbit DRAMs and Beyond", *1991 IEEE International Electron Devices Meeting*, Washington, D.C.,(Dec. 8-11, 1991),469-472.

Pan, Tung M., et al., "High quality ultrathin CoTiO/sub 3/ high-k gate dielectrics", *Electrochemical and Solid-State Letters*, 3(9), (Sep. 2000),433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.

Park, Jaehoo, et al., "Chemical vapor deposition of HfO/sub 2/ thin films using a novel carbon-free precursor: characterization of the interface with the silicon substrate", *Journal of the Electrochemical Society*, 149(1), (2002),G89-G94.

Park, Byung-Eun, et al., "Electrical properties of LaAlO3/Si and Sr0.8Bi2.2Ta2O9/LaAlO3/Si structures", *Applied Physics Letters*, 79(6), (Aug. 2001),806-808.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002),2368-70.

Parke, S. A., et al., "A High-Performance Lateral Bipolar Transistor Fabricated on SIMOX", *IEEE Electron Device Letters*, 14, (Jan. 1993),33-35.

Pein, H., "A 3-D Sidewall Flash EPROM Cell and Memory Array", *IEEE Transactions on Electron Devices*, 40, (Nov. 1993),2126-2127.

Pein, H., "Performance of the 3-D PENCIL Flash EPROM Cell and Memory Array", *IEEE Transactions on Electron Devices*, 42, (Nov. 1995), 1982-1991.

Pein, H. B., "Performance of the 3-D Sidewall Flash EPROM Cell", *IEEE International Electron Devices Meeting, Technical Digest*, (1993),11-14.

Perkins, Charles M., et al., "Electrical and materials properties of ZrO2 gate dielectrics grown by atomic layer chemical vapor deposition", *Applied Physics Letters*, 78(16), (Apr. 2001),2357-2359.

Poveshchenko, V P., et al., "Investigation of the phas composition of films of zirconium, hafnium and yttrium oxides", *Soviet Journal of Optical Technology*, 51(5), (1984),277-279.

Qi, Wen-Jie, et al., "MOSCAP and MOSFET characteristics using Zr02 gate dielectric deposited directly on Si", *Electron Devices Meeting, 1999. IEDM Technical Digest. International*, (1999),145-148.

Qi, Wen-Jie, et al., "Performance of MOSFETs with ultra thin ZrO/sub 2/ and Zr silicate gate dielectrics", *2000 Symposium on VLSI Technology. Digest of Technical Papers*, (2000),40-41.

Rahtu, Antti, et al., "Atomic Layer Deposition of Zirconium Titanium Oxide from Titanium Isopropoxide and Zirconium Chloride", *Chemistry of Materials*, 13(5), (May 2001),1528-1532.

Ramakrishnan, E S., et al., "Dielectric properties of radio frequency magnetron sputter deposited zirconium titanate-based thin films", *Journal of the Electrochemical Society*, 145(1), (Jan. 1998),358-362.

Ramm, J., et al., "Hydrogen cleaning of silicon wafers. Investigation of the wafer surface after plasma treatment", *Thin Solid Films*, 228, (1993),23-26.

Ramo, S., et al., *Fields and Waves in Communication Electronics, Third Edition*, John Wiley & Sons, Inc.,(1994),pp. 428-433.

Rao, K. V., et al., "Trench Capacitor Design Issues in VLSI DRAM Cells", *1986 IEEE International Electron Devices Meeting, Technical Digest*, Los Angeles, CA,(Dec. 7-10, 1986),140-143.

Rayner Jr., G, et al., "The structure of plasma-deposited and annealed pseudo-binary ZrO2-SiO2 alloys", *Materials Research Society Symposium—Proceedings*, 611, (2000),C131-C139.

Richardson, W. F., et al., "A Trench Transistor Cross-Point DRAM Cell", *IEEE International Electron Devices Meeting*, Washington, D.C.,(Dec. 1-4, 1985),714-717.

Ritala, Mikko, "Atomic Layer Epitaxy Growth of Titanium, Zirconium and Hafnium Dioxide Thin Films", *Annales Academiae Scientiarum Fennicae*, (1994),24-25.

Ritala, Mikko, et al., "Zirconium dioxide thin films deposited by ALE using zirconium tetrachloride as precursor", *Applied Surface Science*, 75, (Jan. 1994),333-340.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Rossnagel, S M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Rotondaro, A L., et al., "Advanced CMOS Transistors with a Novel HfSiON Gate Dielectric", *Symposium on VLSI Technology Digest of Technical Papers*, (2002),148-149.

Sagara, K., "A 0.72 micro-meter2 Recessed STC (RSTC) Technology for 256Mbit DRAMs using Quarter-Micron Phase-Shift Lithography", *1992 Symposium on VLSI Technology, Digest of Technical Papers*, Seattle, WA,(Jun. 2-4, 1992),10-11.

Saito, Yuji, et al., "Advantage of Radical Oxidation for Improving Reliability of Ultra-Thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Seevinck, E., et al., "Current-Mode Techniques for High-Speed VLSI Circuits with Application to Current Sense Amplifier for CMOS SRAM's", *IEEE Journal of Solid State Circuits*, 26(4), (Apr. 1991),pp. 525-536.

Semiconductor Industry Associati, "International Technology for Semiconductor Roadmap", http://public.itrs.net/Files/2001ITRS/Links/1999_SIA_Roadmap/. (1999).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, (Sep. 1994),1765-1773.

Shah, A. H., et al., "A 4-Mbit DRAM with Trench-Transistor Cell", *IEEE Journal of Solid-State Circuits*SC-21, (Oct. 1986),618-625.

Shah, A. H., et al., "A 4MB DRAM with Cross-Point Trench Transistor Cell", *1986 IEEE International Solid-State Circuits Conference, Digest of Technical Papers*, (Feb. 21, 1986),268-269.

Shanware, A., et al., "Reliability evaluation of HfSiON gate dielectric film with 12.8 A SiO2 equivalent thickness", *International Electron Devices Meeting. Technical Digest*, (2001),6.6.1-6.6.4.

Sherony, M. J., "Reduction of Threshold Voltage Sensitivity in SOI MOSFET's", *IEEE Electron Device Letters*, 16, (Mar. 1995),100-102.

Shimbo, M., et al., "Silicon-to-Silicon direct bonding method", *J. Appl. Phys.* vol. 60, No. 8, (Oct. 1986),2987-2989.

Shimomura, K., "A 1V 46ns 16Mb SOI-DRAM with Body Control Technique", *1997 IEEE International Solid-State Circuits Conference, Digest of Technical Papers*, (Feb. 6, 1997),68-69.

Shin, Chang H., et al., "Fabriation and Characterization of MFISFET using Al2O3 Insulating Layer for Non-Volatile Memory", *12th International Symposium in Integrated Ferroelectrics*, (Mar. 2000),1-9.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (Jun. 29, 2000),105-14.

Sneh, Ofer, "Thin film atomic layer deposition equipment for semiconductor processing", *Thin Solid Films*, 402(1-2), (Jan. 2002),248-261.

Song, Hyun-Jung, et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999),469-471.

Stanisic, B. R., et al., "Addressing Noise Decoupling in Mixed-Signal IC's: Power Distribution Design and Cell Customization", *IEEE Journal of Solid-State Circuits*, 30, (Mar. 1995),321-326.

Stathis, J. H., et al., "Reliability Projection for Ultra-Thin Oxides at Low Voltage", *Tech. Dig. International Electron Device Meeting*, (1998),167-9.

Stellwag, T. B., "A Vertically-Integrated GaAs Bipolar DRAM Cell", *IEEE Transactions on Electron Devices*, 38, (Dec. 1991),2704-2705.

Su, D. K., et al., "Experimental Results and Modeling Techniques for Substrate Noise in Mixed-Signal Integrated Circuits", *IEEE Journal of Solid-State Circuits*, 28(4), (Apr. 1993),420-430.

Suma, K., et al., "An SOI-DRAM with Wide Operating Voltage Range by CMOS/SIMOX Technology", *IEEE Journal of Solid-State Circuits*, 29(11), (Nov. 1994),pp. 1323-1329.

Sunouchi, K., et al., "A Surrounding Gate Transistor (SGT) Cell for 64/256Mbit DRAMs", *1989 IEEE International Electron Devices Meeting, Technical Digest*, Washington, D.C.,(Dec. 3-6, 1989),23-26.

Sunouchi, K., et al., "Process Integration for 64M DRAM Using an Asymmetrical Stacked Trench Capacitor (AST) Cell", *1990 IEEE International Electron Devices Meeting*, San Francisco, CA,(Dec. 9-12, 1990),647-650.

Suntola, T., "Atomic Layer Epitaxy", *Handbook of Crystal Growth, 3; Thin Films of Epitaxy, Part B: Growth Mechanics and Dynamics*, Amsterdam,(1994),602-663.

Suntola, T, "Atomic layer epitaxy", *Thin Solid Films*, 216(1), (Aug. 28, 1992),84-89.

Sze, S. M., *In: Physics of Semiconductor Devices, Second Edition*, John Wiley & Sons, New York,(1981),p. 42.

Sze, S M., "Physics of Semiconductor Devices", *New York : Wiley*, (1981),431.

Sze, S M., "Physics of Semiconductor Devices", *New York : Wiley*, (1981),473.

Takai, M., et al., "Direct Measurement and Improvement of Local Soft Error Susceptibility in Dynamic Random Access Memories", *Nuclear Instruments & Methods in Physics Research*, B-99, (Nov. 7-10, 1994),562-565.

Takato, H., "High Performance CMOS Surrounding Gate Transistor (SGT) for Ultra High Density LSIs", *IEEE International Electron Devices Meeting, Technical Digest*, (1988),222-225.

Takato, H., et al., "Impact of Surrounding Gate Transistor (SGT) for Ultra-High Density LSI's", *IEEE Transactions on Electron Devices*, 38, (Mar. 1991),573-578.

Takemoto, J. H., et al., "Microstrip Resonators and Filters Using High-TC Superconducting Thin Films on LaAlO3", *IEEE Transaction on Magnetics*, 27(2), (Mar. 1991),2549-2552.

Tanabe, N., et al., "A Ferroelectric Capacitor Over Bit-Line (F-COB) Cell for High Density Nonvolatile Ferroelectric Memories", *1995 Symposium on VLSI Technology, Digest of Technical Papers*, Kyoto, Japan,(Jun. 6-8, 1995),123-124.

Tarre, A, et al., "Comparative study of low-temperature chloride atomic-layer chemical vapor deposition of TiO2 and SnO2", *Applied Surface Science*, 175-176, (May 2001),111-116.

Tavel, B, et al., "High performance 40 nm nMOSFETs with HfO/sub 2/ gate dielectric and polysilicon damascene gate", *Technical Digest of International Electron Devices Meetings 2002*, (2002),429-432.

Temmler, D., "Multilayer Vertical Stacked Capacitors (MVSTC) for 64Mbit and 256Mbit DRAMs", *1991 Symposium on VLSI Technology, Digest of Technical Papers*, Oiso,(May 28-30, 1991),13-14.

Terauchi, M., "A Surrounding Gate Transistor (SGT) Gain Cell for Ultra High Density DRAMs", *1993 Symposium on VLSI Technology, Digest of Technical Papers*, Kyoto, Japan,(1993),21-22.

Tong, Q. Y., et al., "Hydrophobic Silicon Wafer Bonding", *Applied Physics Letter* 64(5), (Jan. 31, 1994),625-627.

Tsui, P. G., et al., "A Versatile Half-Micron Complementary BiCMOS Technology for Microprocessor-Based Smart Power Applications", *IEEE Transactions on Electron Devices*, 42, (Mar. 1995),564-570.

Van Dover, R. B., et al., "Amorphous lanthanide-doped TiOx dielectric films", *Applied Physics Letters*, 74(20), (May 17, 1999),3041-3043.

Van Dover, R B., et al., "Deposition of Uniform Zr-Sn-Ti-O Films by On-Axis Reactive Sputtering", *IEEE Electron Device Letters*, 19(9), (Sep. 1998),329-331.

Van Dover, R. B., et al., "Discovery of a useful thin-film dielectric using a composition-spread approach", *Nature*, 392, (Mar. 12, 1998),162-164.

Verdonckt-Vandebroek, S., et al., "High-Gain Lateral Bipolar Action in a MOSFET Structure", *IEEE Transactions on Electron Devices 38*, (Nov. 1991),2487-2496.

Viirola, H, "Controlled growth of antimony-doped tin dioxide thin films by atomic layer epitaxy", *Thin Solid Films*, 251, (Nov. 1994),127-135.

Viirola, H, "Controlled growth of tin oxide thin films by atomic layer epitaxy", *Thin Solid Films*, 249(2), (Sep. 1994),144-149.

Visokay, M R., "Application of HfSiON as a gate dielectric material", *Applied Physics Letters*, 80(17), (Apr. 2002),3183-3185.

Vittal, A., et al., "Clock Skew Optimization for Ground Bounce Control", *1996 IEEE/ACM International Conference on Computer-Aided Design, Digest of Technical Papers*, San Jose, CA,(Nov. 10-14, 1996),395-399.

Wang, N., *Digital MOS Integrated Circuits*, Prentice Hall, Inc., Englewood Cliffs, NJ,(1989),p. 328-333.

Wang, P. W., "Excellent Emission Characteristics of Tunneling Oxides Formed Using Ultrathin Silicon Films for Flash Memory Devices", *Japanese Journal of Applied Physics*, 35, (Jun. 1996),3369-3373.

Watanabe, H., et al., "A New Cylindrical Capacitor Using Hemispherical Grained Si (HSG-Si) for 256Mb DRAMs", *IEEE International Electron Devices Meeting, Technical Digest*, San Francisco, CA,(Dec. 13-16, 1992),259-262.

Watanabe, S., et al., "A Novel Circuit Technology with Surrounding Gate Transistors (SGT's) for Ultra High Density DRAM's", *IEEE Journal of Solid-State Circuits*, 30, (Sep. 1995),960-971.

Watanabe, H., "A Novel Stacked Capacitor with Porous-Si Electrodes for High Density DRAMs", *1993 Symposium on VLSI Technology, Digest of Technical Papers*, Kyoto, Japan,(1993),17-18.

Watanabe, H., "An Advanced Fabrication Technology of Hemispherical Grained (HSG) Poly-Si for High Capacitance Storage Electrodes", *Extended Abstracts of the 1991 International Conference on Solid State Devices and Materials*, Yokohama, Japan,(1991),478-480.

Watanabe, H., "Device Application and Structure Observation for Hemispherical-Grained Si", *J. Appl. Phys.*, 71, (Apr. 1992),3538-3543.

Watanabe, H., "Hemispherical Grained Silicon (HSG-Si) Formation on In-Situ Phosphorous Doped Amorphous-Si Using the Seeding Method", *Extended Abstracts of the 1992 International Conference on Solid State Devices and Materials*, Tsukuba, Japan,(1992),422-424.

Weldon, M. K., et al., "Physics and Chemistry of Silicon Wafer bonding Investigated by Infrared Absorption Spectroscopy", *Journal of Vacuum Sci. Technology*, B 14(4), c1996 American Vacuum Society,(Jul./Aug. 1996),3095-3106.

Wilk, G D., "Hafnium and zirconium silicates for advanced gate dielectrics", *Journal of Applied Physics*, 87(1), (Jan. 2000),484-492.

Wilk, G. D., et al., "High-K gate dielectrics: Current status and materials properties considerations", *Journal of Applied Physics*, 89(10), (May 2001),5243-5275.

Wolf, Stanley, et al., "Future Trends in Sputter Deposition Processes", *In: Silicon Processing of the VLSI Era*, vol. 1, Lattice Press,(1986),374-380.

Wolf, Stanley, et al., "Silicon Processing for the VLSI Era—vol. I: Process Technology", *Second Edition, Lattice Press*, Sunset Beach, California,(2000),443.

Wolfram, G, et al., "Existence range, structural and dielectric properties of ZrxTiySnzO4 ceramics (x+y =2)", *Materials Research Bulletin*, 16(11), (Nov. 1981),1455-63.

Yamada, T., et al., "A New Cell Structure with a Spread Source/Drain (SSD) MOSFET and a Cylindrical Capacitor for 64-Mb DRAM's", *IEEE Transactions on Electron Devices*, 38, (Nov. 1991),2481-2486.

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C. ,(Dec. 3-6, 1989),35-38.

Yamaguchi, Takeshi, "Band Diagram and Carrier Conduction Mechanism in ZrO2/Zr-silicate/Si MIS Structure Fabricated by Pulsed-laser-ablation Deposition", *Electron Devices Meeting, 2000. IEDM Technical Digest. International*, (2000),19-22.

Yamaguchi, Takeshi, et al., "Study on Zr-Silicate Interfacial Layer of ZrO2-MIS Structure FAbricated by Pulsed Laser Ablation Deposition Method", *Solid State Devices and Materials*, (2000),228-229.

Yamamoto, K., et al., "Effect of Hf metal predeposition on the properties of sputtered HfO2/Hf stacked gate dielectrics", *Applied Physics Letters*, 81(11), (Sep. 9, 2002),2053-5.

Yeh, Ching-Fa, et al., "The advanced improvement of PN mesa junction diode prepared by silicon-wafer direct bonding", *1991 International Symposium on VLSI Technology, Systems, and Applications, 1991. Proceedings of Technical Papers*, (May 22-24, 1991),136-140.

Zhang, H., "Atomic Layer Deposition of High Dielectric Constant Nanolaminates", *Journal of The Electrochemical Society*, 148(4), (Apr. 2001),F63-F66.

Zhang, H, "High permittivity thin film nanolaminates", *Journal of Applied Physics*, 87(4), (Feb. 2000),1921-1924.

Zhu, W, et al., "HfO2 and HfAlO for CMOS: Thermal Stability and Current Transport", *IEEE International Electron Device Meeting 2001*, (2001),463-466.

Zucker, O, et al., "Application of Oxygen Plasma Processing to Silicon Direct Bonding", *Sensors and Actuators A*, (1993),227-231.

Van Dover, R B., "Amorphous lanthanide-doped TiOx dielectric films", *Applied Physics Letters*, 74(20), (May 1999),3041-3043.

Ahn, Kie Y., et al., "Lanthanide Yttrium Aluminum Oxide Dielectric Films", U.S. Appl. No. 11/297,567, filed Dec. 8, 2005.

Ahn, Kie Y., et al., "Lanthanide Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Conley, J.F., "Atomic Layer Deposition of Hafnium Oxide Using Anhydrous Hafnium Nitrate", *Electrochemical and Solid-State Letters*, 5(5), (May 2002),C57-C59.

"U.S. Appl. No. 10/420,307 Partial Prosecution History", (as of Oct. 30, 2007), 164 pgs.

"Application Partial File History U.S. Appl. No. 09/945,535", (downloaded from IFW Oct. 29, 2007), 417 pgs.

"Application Partial File History U.S. Appl. No. 10/028,643", (downloaded from IFW Oct. 29, 2007), 107 pgs.

"Application Partial File History U.S. Appl. No. 10/099,194", (downloaded from IFW Oct. 29, 2007), 97 pgs.

"Application Partial File History U.S. Appl. No. 10/137,499", (downloaded from IFW Oct. 25, 2007), 185 pgs.

"Application Partial File History U.S. Appl. No. 10/163,481", (downloaded from IFW Oct. 25, 2007), 175 pgs.

"Application Partial File History U.S. Appl. No. 10/219,870", (downloaded from IFW Oct. 25, 2007), 76 pgs.

"Application Partial File History U.S. Appl. No. 10/233,309", (downloaded from IFW Oct. 25, 2007), 178 pgs.

"Application Partial File History U.S. Appl. No. 10/931,364", (downloaded from IFW Oct. 25, 2007), 42 pgs.

"Application Partial File History U.S. Appl. No. 11/117,125", (downloaded from IFW Oct. 24, 2007), 44 pgs.

"Application Partial File History U.S. Appl. No. 11/215,412", (downloaded from IFW Oct. 25, 2007), 43 pgs.

"Application Partial File History U.S. Appl. No. 11/215,507", (as of Oct. 29, 2007), 41 pgs.

"Application Partial File History U.S. Appl. No. 11/459,792", (downloaded from IFW Oct. 25, 2007), 45 pgs.

"Application Partial File History U.S. Appl. No. 11/460,203", (as of Oct. 29, 2007), 36 pgs.

"Application Partial File History U.S. Appl. No. 11/493,074", (downloaded from IFW Oct. 25, 2007), 49 pgs.

"Application Partial File History U.S. Appl. No. 11/493,112", (downloaded from IFW Oct. 29, 2007), 44 pgs.

"Application Partial File History U.S. Appl. No. 11/528,776", (as of Oct. 29, 2007), 35 pgs.

"Application Partial File History U.S. Appl. No. 11/566,042", (downloaded from IFW Oct. 24, 2007), 47 pgs.

"Application Partial File History U.S. Appl. No. 11/584,229", (downloaded from IFW Oct. 25, 2007), 54 pgs.

"Application Partial File History U.S. Appl. No. 11/598,437", (downloaded from IFW Oct. 25, 2007), 65 pgs.

"Application Partial File History U.S. Appl. No. 11/608,281", (downloaded from IFW Oct. 29, 2007), 46 pgs.

"Application Partial File History U.S. Appl. No. 11/608,286", (downloaded from IFW Oct. 24, 2007), 43 pgs.

"Partial file history downloaded from Private Pair IFW U.S. Appl. No. 09-797,324", (Downloaded Oct. 23, 2007), 119.

Morais, J., et al., "Composition, atomic transport, and chemical stability of ZrAlxOy ultrathin films deposited on Si(001)", *Applied Physics Letters*, 79(13), (Sep. 24, 2001), 1998-2000.

"Application Partial File History U.S. Appl. No. 10/309,583", (as of Oct. 29, 2007), 114 pgs.

"Application Partial File History U.S. Appl. No. 10/379,470", (downloaded from IFW Oct. 25, 2007), 230 pgs.

"Application Partial File History U.S. Appl. No. 10/403,734", (downloaded from IFW Oct. 25, 2007), 172 pgs.

"Application Partial File History U.S. Appl. No. 10/602,323", (downloaded from IFW Oct. 25, 2007), 140 pgs.

"Application Partial File History U.S. Appl. No. 10/789,042", (downloaded from IFW Oct. 25, 2007), 175 pgs.

"Application Partial File History U.S. Appl. No. 10/909,959", (downloaded from IFW Oct. 29, 2007), 152 pgs.

"Application Partial File History U.S. Appl. No. 10/926,812", (downloaded from IFW Oct. 25, 2007), 148.

"Application Partial File History U.S. Appl. No. 10/930,167", (downloaded from IFW Oct. 24, 2007), 105 pgs.

"Application Partial File History U.S. Appl. No. 10/930,431", (downloaded from IFW Oct. 25, 2007), 129 pgs.

"Application Partial File History U.S. Appl. No. 10/931,341", (downloaded from IFW Oct. 29, 2007), 148 pgs.

"Application Partial File History U.S. Appl. No. 10/931,343", (downloaded from IFW Oct. 25, 2007), 140 pgs.

"Application Partial File History U.S. Appl. No. 10/931,533", (downloaded from IFW Oct. 29, 2007), 162 pgs.

"Application Partial File History U.S. Appl. No. 11/010,529", (downloaded from IFW Oct. 24, 2007), 141 pgs.

"Application Partial File History U.S. Appl. No. 11/031,289", (downloaded from IFW Oct. 25, 2007), 83 pgs.

"Application Partial File History U.S. Appl. No. 11/058,563", (as of IFW Oct. 29, 2007), 161 pgs.

"Application Partial File History U.S. Appl. No. 11/093,104", (as of IFW Oct. 29, 2007), 70 pgs.

"Application Partial File History U.S. Appl. No. 11/117,121", (as of IFW Oct. 29, 2007), 65 pgs.

"Application Partial File History U.S. Appl. No. 11/213,013", (as of IFW Oct. 29, 2007), 104 pgs.

"Application Partial File History U.S. Appl. No. 11/214,693", (as of IFW Oct. 29, 2007), 84 pgs.

"Application Partial File History U.S. Appl. No. 11/215,530", (as of IFW Oct. 29, 2007), 86 pgs.

"Application Partial File History U.S. Appl. No. 11/427,569", (downloaded from IFW Oct. 25, 2007), 66 pgs.

Application U.S. Appl. No. 10/931,845 Non-Final Office Action mailed Oct. 16, 2007, 15.

"Partial File History U.S. Appl. No. 11/055,380", (as of IFW Oct. 29, 2007), 102 pgs.

Application U.S. Appl. No. 10/909,959, Response filed Nov. 8, 2007 to Final Office Action mailed Aug. 8, 2007, 13 pgs.

Application U.S. Appl. No. 10/930,431, Response filed Nov. 19, 2007 to Final Office Action, 11 pgs.

Application U.S. Appl. No. 10/931,341, Response filed Nov. 13, 2007 to Final Office Action mailed Sep. 12, 2007, 12 pgs.

Application U.S. Appl. No. 11/010,529, Notice of Allowance mailed Feb. 13, 2007, 4 pgs.

Application U.S. Appl. No. 11/031,289, Response filed Nov. 13, 2007 to Non-Final Office Action mailed Aug. 10, 2007, 10 pgs.

Application U.S. Appl. No. 11/427,569, Notice of Allowance mailed Nov. 15, 2007, 10 pgs.

Ahn, et al., "ALD of Zr-Substituted BaTiO3 Films as Gate Dielectrics", U.S. Appl. No. 11/498,559, filed Aug. 3, 2006.

Ahn, et al., "Atomic Layer Deposited Barium Strontium Titanium Oxide Films", U.S. Appl. No. 11/510,803, filed Aug. 26, 2006.

Ahn, et al., "Atomic Layer Deposition of GDSC03 Films as Gate Dielectrics", U.S. Appl. No. 11/216,958, filed Aug. 30, 2005.

Ahn, et al., "Cobalt Titanium Oxide Dielectrics Films", U.S. Appl. No. 11/216,958, filed Aug. 31, 2005.

Ahn, et al., "Hafnium Lanthanide Oxynitride Films", U.S. Appl. No. 11/515,143, filed Aug. 31, 2006.

Ahn, et al., "Magnesium-Doped Zinc Oxide Structures and Methods", U.S. Appl. No. 11/706,820, filed Feb. 13, 2007.

Ahn, et al., "Methods to Form Dielectric Structures in Semiconductor Devices and Resulting Devices", U.S. Appl. No. 11/581,675, filed Aug. 16, 2006.

Ahn, et al., "Molybdenum-Doped Indium Oxide Structures and Methods", U.S. Appl. No. 11/706,944, filed Feb. 13, 2007.

Ahn, et al., "Tungsten-Doped Indium Oxide Structures and Methods", U.S. Appl. No. 11/706,498, filed Feb. 13, 2007.

Ahn, et al., "Zirconium-Doped Zinc Oxide Structures and Methods", U.S. Appl. No. 11/707,173, filed Feb. 13, 2007.

Forbes, "Hafnium Aluminium Oxynitride High-K Dielectric and Metal Gates", U.S. Appl. No. 11/514,558, filed Aug. 31, 2006.

Forbes, "Hafnium Aluminium Oxynitride High-K Dielectric and Metal Gates", U.S. Appl. No. 11/515,114, filed Aug. 31, 2005.

Forbes, Leonard, et al., "Silicon Lanthanide Oxynitride Films", U.S. Appl. No. 11/514,533, filed Aug. 31, 2006.

Forbes, "Tantalum Aluminium Oxynitride High-K Dielectric and Metal Gates", U.S. Appl. No. 11/514,655, filed Aug. 31, 2006.

Forbes, Leonard, et al., "Tantalum Silicon Oxynitride High-K Dielectric and Metal Gates", U.S. Appl. No. 11/514,601, filed Aug. 31, 2006.

Nalwa, H. S., "Handbook of Thin Film Materials", *Deposition and Processing of thin Films*, vol. 1, San Diego : Academic Press,(2002),114-119.

* cited by examiner

METHODS, SYSTEMS, AND APPARATUS FOR UNIFORM CHEMICAL-VAPOR DEPOSITIONS

This application is a Divisional of U.S. application Ser. No. 09/797,324, filed Mar. 1, 2001, now U.S. Pat. No. 6,852,167, which is incorporated herein by reference.

TECHNICAL FIELD

This invention concerns methods of making integrated circuits, particularly layer-formation, such as chemical-vapor deposition.

BACKGROUND OF THE INVENTION

Integrated circuits, the key components in thousands of electronic and computer products, are interconnected networks of electrical components fabricated on a common foundation, or substrate. Fabricators generally build these circuits layer by layer, using techniques, such as deposition, doping, masking, and etching, to form thousands and even millions of microscopic resistors, transistors, and other electrical components on a silicon substrate, known as a wafer. The components are then wired, or interconnected, together to define a specific electric circuit, such as a computer memory.

One common technique for forming layers in an integrated circuit is called chemical vapor deposition. Chemical vapor deposition generally entails placing a substrate in a reaction chamber, heating the substrate to prescribed temperatures, and introducing one or more gases, known as precursor gases, into the chamber to begin a deposition cycle. The precursor gases enter the chamber through a gas-distribution fixture, such as a gas ring or a showerhead, one or more centimeters above the substrate, and descend toward the heated substrate. The gases react with each other and/or the heated substrate, blanketing its surface with a layer of material. An exhaust system then pumps gaseous by-products or leftovers from the reaction out of the chamber through a separate outlet to complete the deposition cycle.

Conventional chemical-vapor-deposition (CVD) systems suffer from at least two problems. First, conventional CVD systems generally form layers that include microscopic hills and valleys and thus have non-uniform thickness. In the past, fabricators have been able to overcome these hills and valleys through use of post-deposition planarization or other compensation techniques. However, escalating demands for greater circuit density, for thinner layers, and for larger substrates make it increasingly difficult, if not completely impractical, to overcome the non-uniform thickness of conventional CVD layers.

Second, some conventional CVD systems are also inefficient and time consuming. One significant factor affecting both CVD efficiency and duration is the size of conventional reaction chambers, which are generally made large to allow a loading mechanism to insert and extract the substrate. Large chambers generally require more gases to be introduced to achieve desired gas concentrations. However, much of this gas is not only unnecessary based on the amount of material deposited, but is typically treated as waste. Moreover, large chambers also take longer to fill up or pump out, prolonging deposition cycles and thus slowing fabrication of integrated circuits.

Accordingly, there is a need for better systems and methods of chemical-vapor deposition.

SUMMARY OF THE INVENTION

To address these and other problems, the present inventor devised new systems, methods, and apparatuses for chemical-vapor deposition. One exemplary chemical-vapor deposition system includes an outer chamber, a substrate holder, and a unique gas-distribution fixture. The fixture includes a gas-distribution surface having holes for dispensing a gas and a gas-confinement member that forms a wall around the holes. In operation, the gas-confinement member engages, or otherwise cooperates with the substrate holder to form an inner chamber within the outer chamber.

The inner chamber has a smaller volume than the outer chamber and thus consumes less gas during the deposition process than would the outer chamber used alone. Also, the smaller chamber volume allows the exhaust system to pump the chamber more quickly, thus increasing the rate of the CVD process. In addition, the exemplary showerhead is made of a material, like silicon, which can be easily passivated to reduce reaction with reactive gases, thus reducing chemical-vapor buildup in the showerhead. Also, the exemplary showerhead includes a configuration of holes that permits uniform gas flow.

DESCRIPTION OF THE PREFERRED EMBODIMENTS

The following detailed description, which references and incorporates FIGS. 1–4, describes and illustrates specific embodiments of the invention. These embodiments, offered not to limit but only to exemplify and teach the invention, are shown and described in sufficient detail to enable those skilled in the art to make and use the invention. Thus, where appropriate to avoid obscuring the invention, the description may omit certain information known to those of skill in the art.

Figure 1:
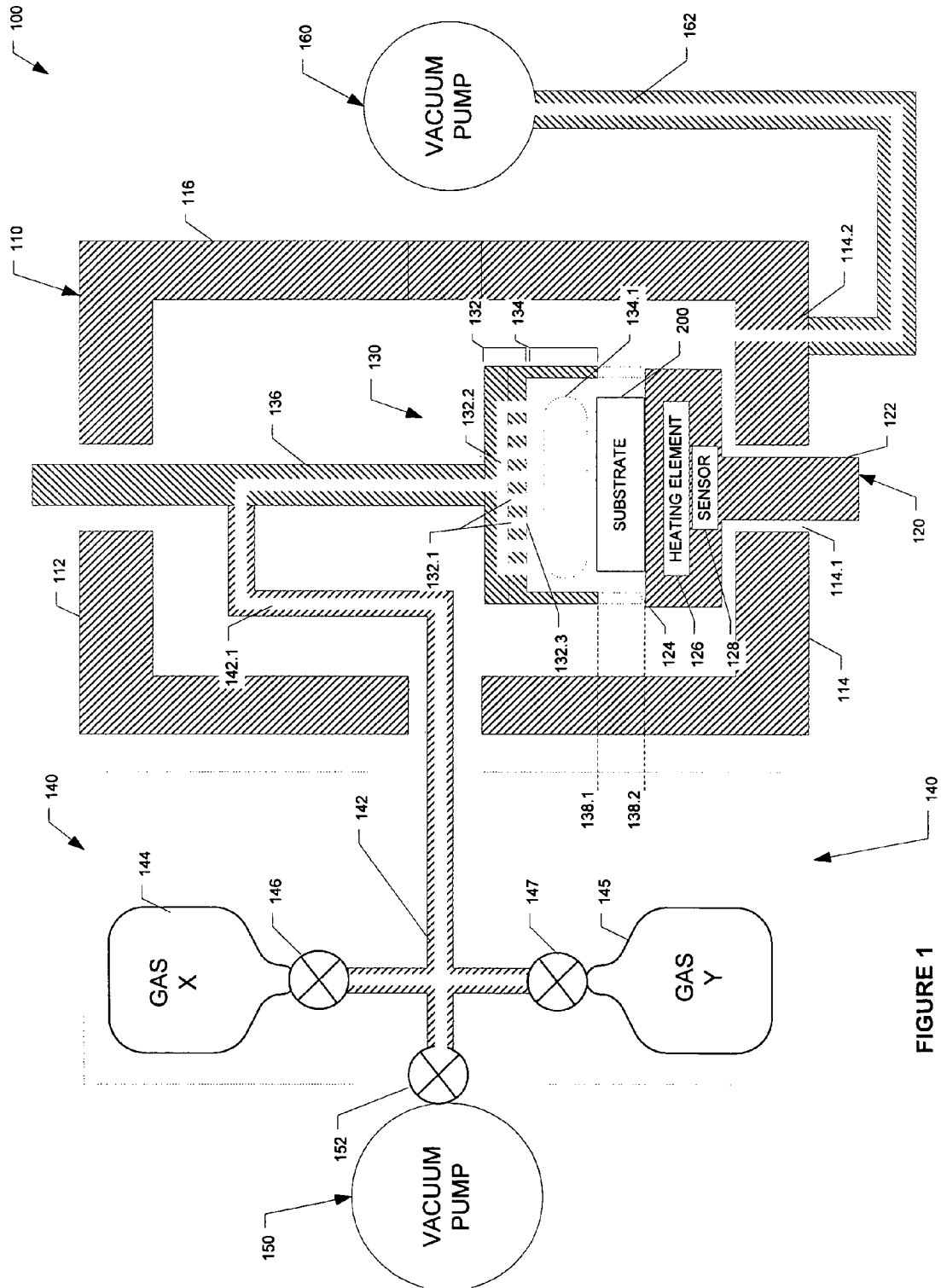
FIG. 1 is a side view of an exemplary deposition reactor according to the invention.

FIG. 1 shows an exemplary chemical-vapor-deposition system 100 which incorporates teachings of the present invention. In particular, system 100 includes a chamber 110, a wafer holder 120, a gas-distribution fixture 130, a gas supply system 140, and exhaust pump 150, and a exhaust pump 160.

More particularly, chamber 110 includes respective top and bottom plates 112 and 114 and a sidewall 116. In the exemplary embodiment, chamber 110 is a cylindrical structure formed of stainless steel or glass. However, other embodiments use different structures and materials. Bottom plate 114 includes an opening 114.1. Extending through opening 114.1 is a stem portion 122 of wafer holder 120.

Wafer holder 120 also includes a support platform 124, one or more heating elements 126, and one or more temperature sensors 128. Support platform 124 supports one or more substrates, wafers, or integrated-circuit assemblies 200. Substrate 200 has an exemplary width or diameter of about 30 centimeters and an exemplary thickness in the range of 850–1000 microns. (The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.) Heating elements 126 and temperature sensors 128 are used for heating substrates 200 to a desired temperature. Holder 120 is coupled to a power supply and temperature control circuitry (both of which are not shown.) In the exemplary embodiment, wafer holder 120 is rotatable either manually or automatically and raises via manual or automatic lever mechanism (not shown). Above wafer holder 120 and substrate 200 is gas-distribution fixture 130.

Fixture 130 includes a gas-distribution member 132, a surface-projection (or gas-confinement) member 134, and a gas inlet 136. Gas inlet 132 couples to gas-supply, gas-distribution channels 134, and a gas inlet 136. In the exemplary embodiment, fixture 130 has two operating positions 138.1 and 138.2 relative support platform 124. Fixture 130 takes operating position 138.1, before and after depositions and operating position 138.2 during depositions.

Gas-distribution member 132 includes gas-distribution holes, or orifices, 132.1 and gas-distribution channels 132.2. Holes 132.1 define a gas-distribution surface 132.3. In the exemplary embodiment, holes 132.1 are substantially circular with a common diameter in the range of 15–20 microns; gas-distribution channels 132.2 have a common width in the range of 20–45 microns; and surface 132.3 is substantially planar and parallel to support platform 124 of wafer holder 120. However, other embodiments use other surface forms as well as shapes and sizes of holes and channels. The distribution and size of holes may also affect deposition thickness and thus might be used to assist thickness control. Holes 132.1 are coupled through gas-distribution channels 132.2 to gas inlet 136.

Surface-projection member 134 projects or extends from surface 132.3 toward support platform 124, defining a fixture cavity 134.1. The exemplary embodiment forms surface-projection member 134 from stainless steel as a uniform annular or circular wall or collar that projects perpendicularly from surface 132 to define a right-cylindrical cavity. However, other embodiments form member 134 to project at other angles relative surface 132.3. For example, some form the projection at an acute or obtuse angle, such as 45 or 135 degrees, and others form the projection to peripherally define an oval, ellipse, triangle, square, or any desirable regular or irregular polygon. Thus, the present invention encompasses a wide variety of projection shapes and configurations, indeed any projection shape that facilitates definition of an effective cavity or gas-confinement volume in cooperation with wafer holder 120 and/or substrate 200.

Figure 2:
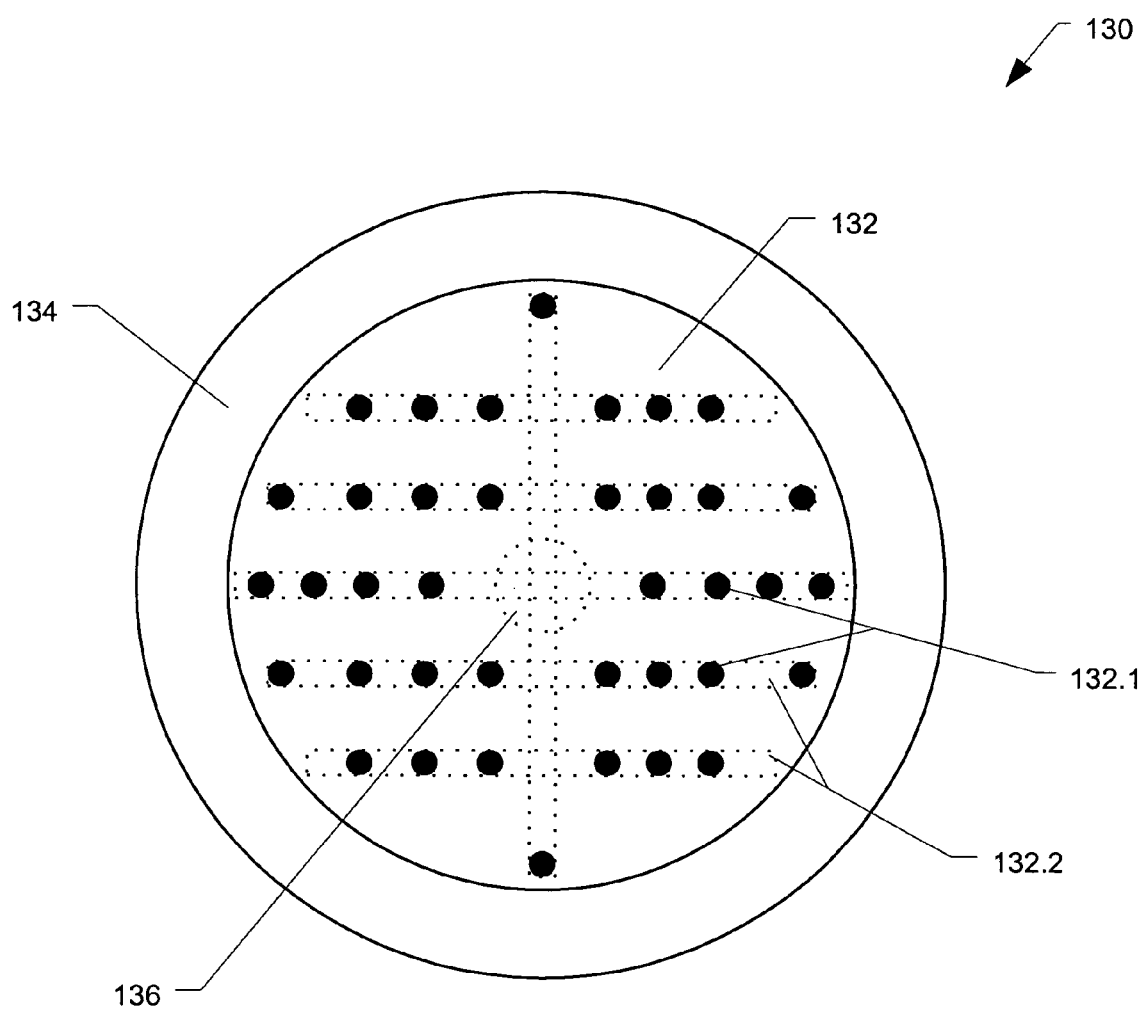
FIG. 2 is a top view of an exemplary gas-distribution fixture according to the invention.

FIG. 2, a plan view, shows further details of the exemplary embodiment of gas-distribution fixture 130. In particular, the plan view shows not only exemplary circular peripheries of gas-distribution member 132 and surface-projection member 134, but also an exemplary distribution pattern for holes 132.1 and an exemplary orthogonal arrangement of gas-distribution channels 132.2. Other embodiments, however, use other hole distribution patterns and channel arrangements. For example, some embodiments include random or concentric hole patterns and various channel geometries, including concentric circles, rectangles, or other regular or irregular concentric polygons. Some embodiments may also dedicate various subsets of channels and corresponding holes to different gases.

Gas-distribution member 132 can be made in a number of ways. One exemplary method entails providing two wafers of materials, such as silicon or other passivatable, inert, or non-reactive material. One wafer is patterned and etched, for example, using conventional photolithographic or micro-electro-mechanical systems (MEMS) technology, to form a pattern holes, and the other wafer is patterned and etched to include a complementary or corresponding pattern of gas-distribution channels. (MEMS refers to the technologies of making structures and devices with micrometer dimensions.) Dry-etching techniques produce small openings and channels, while wet etching produces larger openings and channels. For further details, see, for example, M. Engelhardt, "Modern Application of Plasma Etching and Patterning in Silicon Process Technology," Contrib. Plasma Physics, vol. 39, no. 5, pp. 473–478 (1999).

The two wafers are then bonded together with the holes and channels in appropriate alignment using known wafer-bonding techniques. See, for example, G. Krauter et al., "Room Temperature Silicon Wafer Bonding with Ultra-Thin Polymer Films," Advanced Materials, vol. 9, no. 5, pp. 417–420 (1997); C. E. Hunt et al., "Direct Bonding of Micromachined Silicon Wafers for Laser Diode Heat Exchanger Applications," J. Micromech. Microeng, vol. 1, pp. 152–156 (1991); Zucker, O. et al., "Applications of oxygen plasma processing to silicon direct bonding," Sensors and Actuators, A. Physical, vol. 36, no. 3, pp. 227–231 (1993), which are all incorporated herein by reference. See also, copending and co-assigned U.S. patent application Ser. No. 09/189,276 entitled "Low Temperature Silicon Wafer Bond Process with Bulk Material Bond Strength," which was filed Nov. 10, 1998 and which is also incorporated herein by reference. The resulting bonded structure is then passivated using thermal oxidation for example.

For an alternative fixture structure and manufacturing method that can be combined with those of the exemplary embodiment, see U.S. Pat. No. 5,595,606, entitled "Shower Head and Film Forming Apparatus Using Same, which is incorporated herein by reference. In particular, one embodiment based on this patent adds a projection or gas-confinement member to the reported showerhead structure.

FIG. 1 also shows that gas inlet 136 couples gas-distribution fixture 130 to gas-supply system 140. Gas-supply system 140 includes a gas line 142, gas sources 144 and 145, and mass-flow controllers 146 and 147. Gas line or conduit 142, which includes a flexible portion 142.1, passes through an opening 116.1 in chamber sidewall 116 to connect with gas inlet 136. Gas source 144 is coupled via mass-flow controller 146 to gas line 142, and gas source 147 is coupled via mass-flow controller 147 to gas line 142. The exemplary embodiment provides computer-controlled thermal or pressure-based mass-flow controllers; however, the invention is not limited to any particular number or type of mass-flow controller, nor to any particular number or set of gas sources.

System 100 also includes vacuum pumps 150 and 160. Vacuum pump 150 is coupled to gas-distribution fixture 130 via a mass-flow controller 152 and gas line 142. And, vacuum pump 160 is coupled to the interior of chamber 110 via a line 162 and an opening 114.2 in chamber bottom plate 114. In the exemplary embodiment, vacuum pump 160 has a greater capacity than vacuum pump 150.

In general operation, system 100 functions, via manual or automatic control, to move gas-distribution fixture 130 from operating position 138.1 to position 138.2, to introduce reactant gases through fixture 130 onto substrate 200, and to deposit desired matter through chemical-vapor deposition onto the substrate. After the desired matter is deposited, pump 150 evacuates gases through fixture 130.

Figure 3:
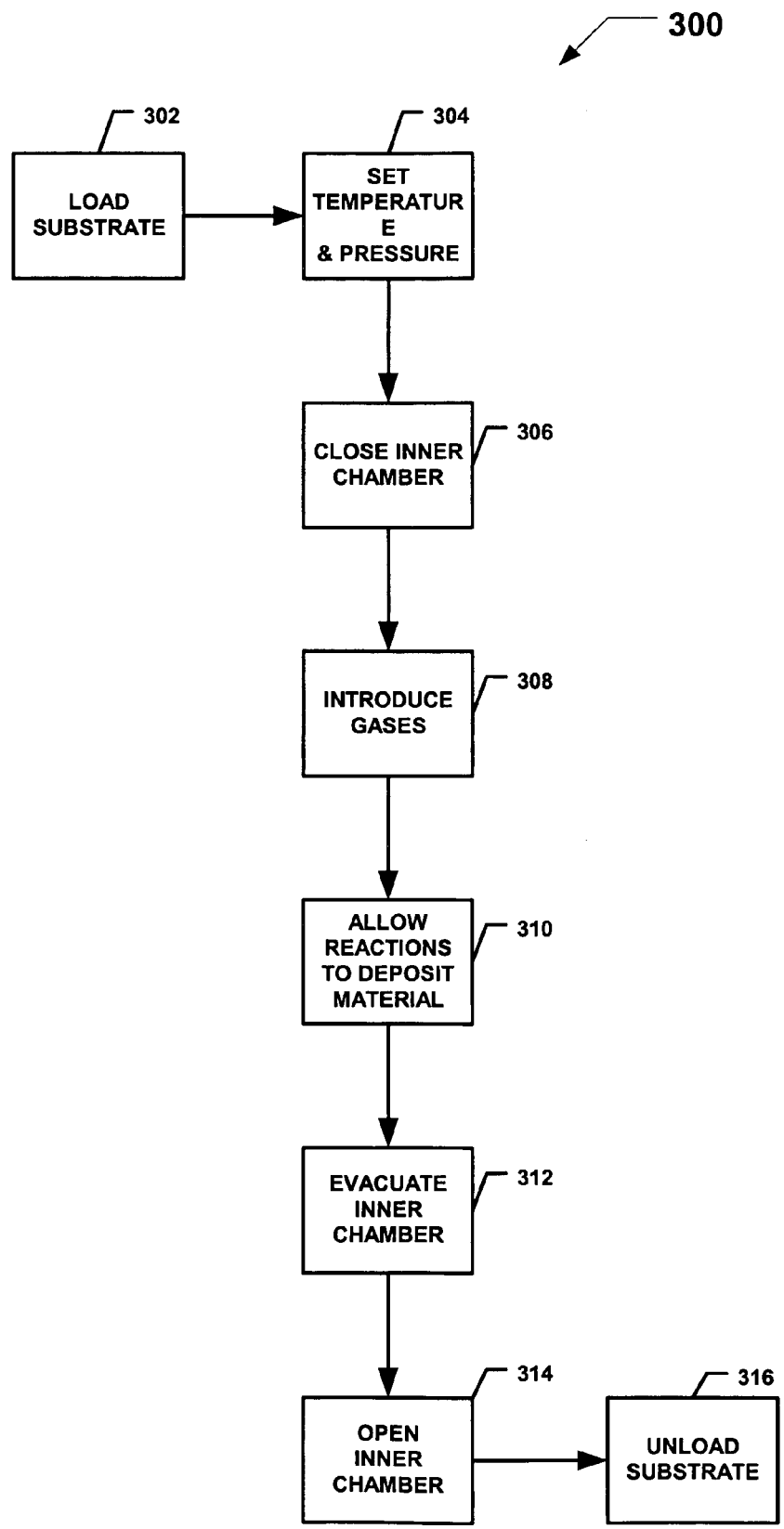
FIG. 3 is a flowchart showing an exemplary method according to the invention.

More particularly, FIG. 3 shows a flowchart 300 which illustrates an exemplary method of operating system 100. Flowchart 300 includes process blocks 202–216.

The exemplary method begins at block 302 with insertion of substrate 300 onto wafer holder 120. Execution then proceeds to block 304.

Block 304 establishes desired temperature and pressure conditions within chamber 110. In the exemplary embodiment, this entails operating heating element 126 to heat substrate 200 to a desired temperature, and operating vacuum pump 160 to establish a desired pressure. Temperature and pressure are selected based on a number of factors, including composition of the substrate and reactant gases, as well as the desired reaction. After establishing these deposition conditions, execution continues at block 306.

In block 306, the system forms or closes an inner chamber around substrate 200, or more precisely a portion of substrate 200 targeted for deposition. In the exemplary embodiment, this entails using a lever or other actuation mechanism (not shown) to move gas-distribution fixture 130 from position 138.1 to position 138.2 or to move wafer holder 120 from position 138.2 to 138.1. In either case, this movement places gas-distribution surface 132.3 one-to-five millimeters from an upper most surface of substrate 200. In this exemplary position, a lower-most surface of surface-projection member 134 contacts the upper surface of support platform 124, with the inner chamber bounded by gas-distribution surface 132.3, surface-projection member 134, and the upper surface of support platform 124.

Other embodiments define in the inner chamber in other ways. For example, some embodiments include a surface-projection member on support platform 124 of wafer holder 120 to define a cavity analogous in structure and/or function to cavity 134.1. In these embodiments, the surface-projection member takes the form of a vertical or slanted or curved wall, that extends from support platform 124 and completely around substrate 200, and the gas-distribution fixture omits a surface-projection member. However, some embodiments include one or more surface-projection members on the gas-distribution fixture and the on the support platform, with the projection members on the fixture mating, engaging, or otherwise cooperating with those on the support platform to define a substantially or effectively closed chamber. In other words, the inner chamber need not be completely closed, but only sufficiently closed to facilitate a desired deposition.

After forming the inner chamber, the exemplary method continues at block 308. Block 308 entails introducing one or more reactant or precursor gases into the separate chamber. To this end, the exemplary embodiment operates one or more mass-flow controllers, such as controllers 146 and 147, to transfer gases in controlled quantities and temporal sequences from gas sources, such as sources 144 and 147, through gas line 142 and fixture 130 into the separate chamber.

Notably, the inner chamber is smaller in volume than chamber 100 and thus requires less gas and less fill time to achieve desired chemical concentrations (assuming all other factors equal.) More precisely, the exemplary embodiment provides an inner chamber with an empty volume in the range of 70 to 350 cubic centimeters, based on a 1-to-5 millimeter inner-chamber height and a fixture with a 30-centimeter diameter. Additionally, the number and arrangement of holes in the fixture as well as the placement of the holes close to the substrate, for example within five millimeters of the substrate, promote normal gas incidence and uniform distribution of gases over the targeted portion of substrate 200.

Block 310 entails allowing the gases to react with each other and/or the heated substrate to deposit a layer of material on targeted portions of the substrate.

It is expected that the resulting layer will exhibit a highly uniform thickness across the entire substrate because of the more uniform gas distribution.

Next, as block 312 shows, the exemplary method entails evacuating gaseous waste or by-products produced during the deposition. To this end, the exemplary embodiment, activates vacuum pump 160 to pump gaseous waste from the inner chamber through gas-distribution fixture 130. In some embodiments, pumps 150 and 160 are operated concurrently to establish initial pressure conditions and to evacuate the inner and outer chambers after deposition.

In block 314, the system opens the separate chamber. In the exemplary embodiment, this entails automatically or manually moving gas-distribution fixture 130 to position 138.1. Other embodiments, however, move the wafer holder or both the fixture and the wafer holder. Still other embodiments may use multipart collar or gas-confinement members which are moved laterally relative the wafer holder or gas-distribution fixture to open and close an inner chamber.

In block 316, substrate 200 is unloaded from chamber 110. Some embodiments remove the substrate manually, and others remove it using an automated wafer transport system.

Figure 4:
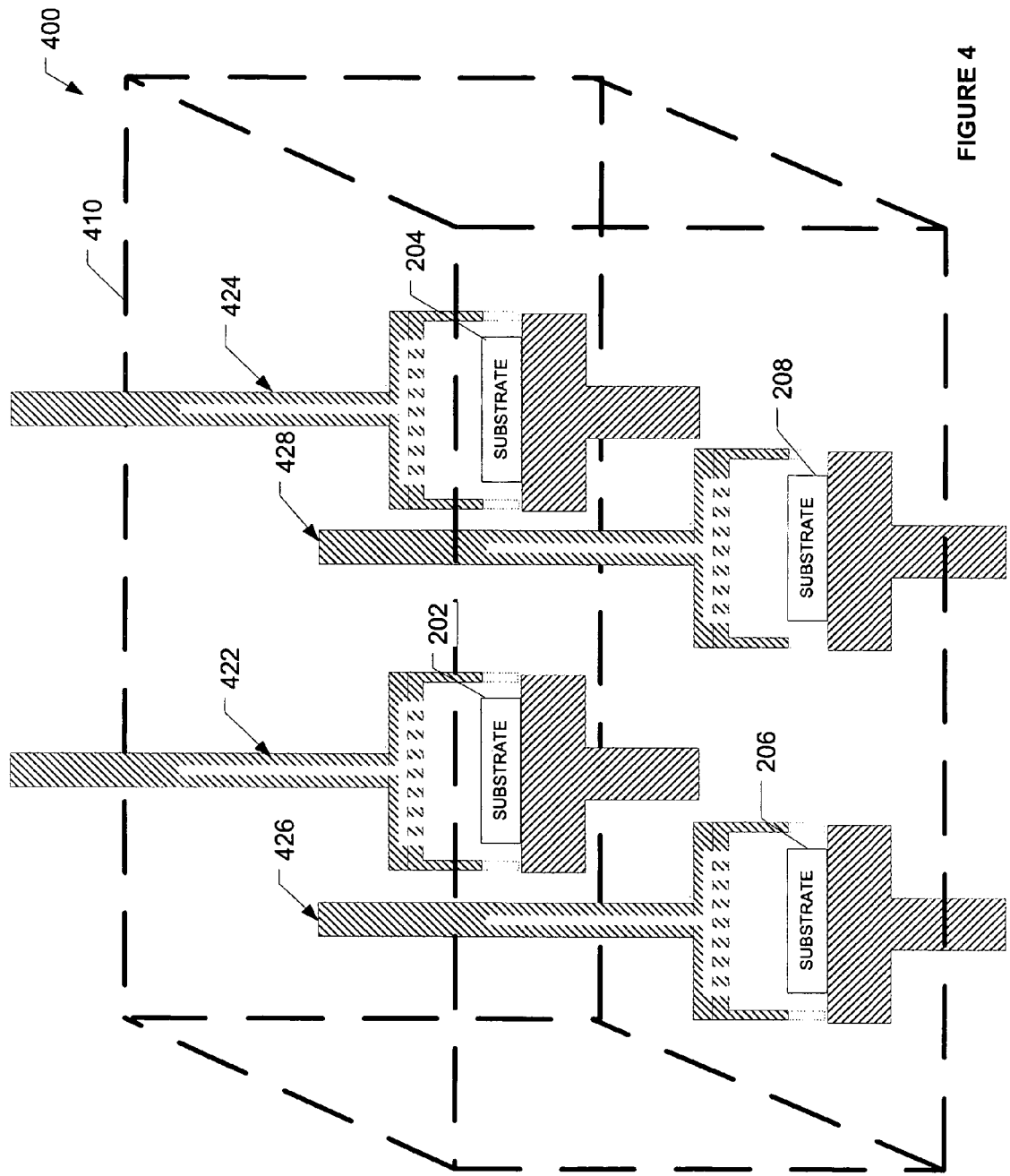
FIG. 4 is a diagram of an exemplary deposition system 400 incorporating a set of four deposition stations similar in structure and function to system 100 of FIG. 1.

FIG. 4 shows a conceptual representation of another exemplary chemical-vapor-deposition system 400 incorporating teachings of the present invention. System 400 includes a rectangular outer chamber 410 which encloses four deposition stations 420, 422, 424, and 426, loaded with respective substrates 200, 202, 204, and 206. Although the figure omits numerous components for clarity, each deposition station is structurally and operationally analogous to system 100 in FIG. 1. In the exemplary embodiment, two or more of the stations are operated in parallel. Additionally, other embodiments of this multi-station system arrange the stations in a cross formation, with each station confronting a respective lateral face of the chamber. Still other embodiments use different outer chamber geometries, for example cylindrical or spherical.

CONCLUSION

In furtherance of the art, the inventor has presented new systems, methods, and apparatuses for chemical-vapor deposition. One exemplary system includes an outer chamber, a substrate holder, and a unique gas-distribution fixture. The fixture includes a gas-distribution surface having holes for dispensing a gas and a gas-confinement member that engages, or otherwise cooperates with the substrate holder to form an inner chamber within the outer chamber.

Notably, the inner chamber not only consumes less gas during deposition to reduce deposition waste and cost, but also facilitates rapid filling and evacuation to reduce deposition cycle times (with all other factors being equal.) The inner chamber also places the gas-distribution fixture within several millimeters of a substrate on the substrate holder, promoting normal gas incidence across the chamber and thus uniform deposition thickness.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

The invention claimed is:

1. A method comprising:

introducing gas into a closed inner chamber within an outer chamber through a gas-distribution fixture in a chemical-vapor-deposition system, with the fixture for distributing gas over a substrate;

operating a pump to evacuate gas from the outer chamber through the gas-distribution fixture, wherein evacuating gas occurs after introducing gas; and changing relative position of the gas-distribution fixture and a substrate to form the closed inner chamber from the gas distribution fixture and a substrate holder before introducing gas, wherein the gas-distribution fixture includes a gas-distribution surface having a plurality of holes and a gas-confinement member extending from the gas-distribution surface around the plurality of holes; and wherein changing relative position of the fixture and the substrate includes moving the fixture from at least a first operating position where the gas-confinement member is physically apart from the substrate holder to a second operating position where the gas-confinement member is in physical contact with the substrate holder.

2. The method of claim 1, wherein operating a pump to evacuate gas from the chamber through the gas-distribution fixture after introducing gas includes operating a pump to evacuate gas from the inner chamber.

3. The method of claim 1, wherein changing relative position of the gas-distribution fixture and a substrate to form a closed inner chamber includes forming a closed chamber having an empty volume in the range of 70 to 350 cubic centimeters.

4. The method of claim 3, wherein the outer chamber has a volume greater than the closed inner chamber.

5. The method of claim 1, wherein changing relative position of the gas-distribution fixture and a substrate to form a closed inner chamber includes moving the gas-distribution surface of the gas-distribution fixture to within one to five millimeters of the substrate.

6. A method comprising:

loading at least one substrate into a first chamber of a chemical-vapor-deposition system;

heating the one substrate to a desired temperature;

reducing pressure in the first chamber;

forming a closed second chamber around the substrate, wherein forming the closed second chamber around the one substrate comprises reducing a distance between the gas-distribution fixture and the substrate to form the closed second chamber from the gas-distribution fixture and a substrate-support surface;

introducing one or more gases through a gas-distribution fixture into the second chamber to deposit a layer of material on the one substrate;

evacuating gas from the second chamber;

opening the second chamber;

unloading the one substrate from the first chamber;

wherein the gas-distribution fixture includes a gas-distribution surface having a plurality of holes and a gas-confinement member extending from the gas-distribution surface around the plurality of holes; and wherein reducing the distance between the gas-distribution fixture and the substrate comprising moving the gas-confinement member toward the substrate-support surface that is supporting the substrate, such that the gas-confinement member contacts the substrate-support surface.

7. The method of claim 6, wherein the gas-confinement member consists essentially of a material different from that of the gas-distribution surface.

8. The method of claim 6, wherein reducing pressure in the first chamber comprises using a first pump and evacuating gas from the second chamber comprises using a second pump to pump gas through the gas-distribution fixture.

9. The method of claim 6, wherein evacuating gas from the second chamber includes reducing pressure includes operating a same pump that reduces pressure in the first chamber.

10. The method of claim 6, wherein forming a closed second chamber includes enclosing an empty volume in the range of 70 to 350 cubic centimeters adjacent a substrate.

11. The method of claim 6, wherein the outer chamber has a volume greater than the closed inner chamber.

12. A method comprising:

introducing gas into the chamber through a gas-distribution fixture in a chemical-vapor-deposition system, with the fixture for distributing gas over a substrate and including:

a gas-distribution member comprising:

a first plate having one or more gas-distribution channels, a second plate adjacent the first plate and having a plurality of holes that define a gas-distribution surface, and a gas-confinement member extending from the gas-distribution surface around the plurality of holes;

evacuating gas from the chamber through the gas-distribution fixture; and changing a relative position of the gas-distribution fixture and a substrate before introducing the gas; wherein changing relative position of the fixture and the substrate comprising moving the fixture from at least a first operating position apart from a substrate support surface to a second operating position in contact with a substrate-support surface to define a closed first chamber formed by the gas-distribution fixture and the substrate support surface within the chamber.

13. The method of claim 12, wherein evacuating gas occurs after introducing gas.

14. The method of claim 12, wherein evacuating gas from the chamber comprises operating a pump coupled to the gas-distribution fixture.

15. A method comprising:

loading at least one substrate into a first chamber of a chemical-vapor-deposition system;

heating the one substrate to a desired temperature;

reducing pressure in the first chamber;

forming a closed second chamber around the one substrate;

introducing one or more gases through a gas-distribution fixture into the second chamber to deposit a layer of material on the one substrate, the fixture including:

a gas-distribution member comprising:

a first plate having one or more gas-distribution channels;

a second plate adjacent the first plate and having a plurality of holes that define a gas-distribution surface; and a gas-confinement surface extending from the gas-distribution surface around the plurality of holes, wherein forming the closed second chamber around the one substrate comprises moving the gas-distribution fixture from at least a first operating position to a second operating position with the second operating position placing the gas-confinement surface in contact with a substrate-support surface to define the closed second chamber;

evacuating gas from the second chamber;

opening the second chamber; and unloading the one substrate from the first chamber.

16. The method of claim 15, wherein the gas-confinement surface is spaced from an interior sidewall of the first chamber, nonparallel to the gas-distribution surface, and movable in unison with the gas-distribution member from the first to the second operating position.

17. The method of claim 15, wherein reducing pressure in the first chamber comprises using a first pump and evacuating gas from the second chamber comprises using a second pump to pump gas through the gas-distribution fixture.

18. A method comprising:

loading at least one substrate into a first chamber of a chemical-vapor-deposition system;

heating the one substrate to a desired temperature;

reducing pressure in the first chamber using a first pump;

forming a closed second chamber around the one substrate;

introducing one or more gases through a gas-distribution fixture into the second chamber to deposit a layer of material on the one substrate, the fixture including:

a gas-distribution member comprising:

a first silicon plate having one or more gas-distribution channels;

a second silicon plate adjacent the first plate and having a plurality of holes that define a gas-distribution surface;

a bond between the first and second silicon plates; and a gas-confinement surface extending from the gas-distribution surface around the plurality of holes;

wherein forming the closed second chamber around the one substrate comprises moving the gas-distribution fixture from at least a first operating position to a second operating position with the second operating position placing the gas-confinement surface in contact with a substrate-support surface to form the closed second chamber from the gas-distribution fixture and the substrate-support surface;

evacuating gas from the second chamber using a second pump to pump gas through the gas-distribution fixture;

opening the second chamber; and unloading the one substrate from the second chamber.

19. The method of claim 18, wherein the second chamber is sized to contain a wafer having a 300-millimeter width or diameter.

20. The method of claim 18, wherein the second chamber is sized to contain a wafer having a 300-millimeter width or diameter and to define a volume in the range of 70–350 cubic centimeters.

21. The method of claim 18, wherein the second operating position is for placing the gas-distribution surface in the range of 1–5 millimeters from an uppermost surface of a wafer on the wafer-support surface.

22. The method of claim 18 wherein the first pump has a greater capacity than the second pump.

* * * * *